US012648181B2

(12) United States Patent
Chu et al.

(10) Patent No.: US 12,648,181 B2
(45) Date of Patent: Jun. 2, 2026

(54) MULTIPLE GATE PATTERNING METHODS TOWARDS FUTURE NANOSHEET SCALING

(71) Applicant: Taiwan Semiconductor Manufacturing Co., Ltd., Hsinchu (TW)

(72) Inventors: Lung-Kun Chu, Hsinchu (TW); Jia-Ni Yu, Hsinchu (TW); Chun-Fu Lu, Hsinchu (TW); Mao-Lin Huang, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 590 days.

(21) Appl. No.: 18/167,718

(22) Filed: Feb. 10, 2023

(65) Prior Publication Data

US 2024/0096994 A1 Mar. 21, 2024

Related U.S. Application Data

(60) Provisional application No. 63/408,781, filed on Sep. 21, 2022.

(51) Int. Cl.
H01L 29/423 (2006.01)
H01L 29/06 (2006.01)
(Continued)

(52) U.S. Cl.
CPC ....... H10D 30/6735 (2025.01); H10D 30/014 (2025.01); H10D 30/43 (2025.01);
(Continued)

(58) Field of Classification Search
CPC .. H10D 30/6735; H10D 30/014; H10D 30/43; H10D 30/6757; H10D 62/121;
(Continued)

(56) References Cited

U.S. PATENT DOCUMENTS 9,236,267 B2 1/2016 De et al.
9,502,265 B1 11/2016 Jiang et al.
(Continued)

FOREIGN PATENT DOCUMENTS

| CN | 113130655 A | * 7/2021 | ....... H10D 64/01318 |
| TW | 202209575 A | 3/2022 | |
| TW | 202232585 A | 8/2022 | |

*Primary Examiner* — Tong-Ho Kim

(74) *Attorney, Agent, or Firm* — Seed IP Law Group

(57) ABSTRACT

A method for forming a semiconductor device is provided. The method includes forming a plurality of first channel nanostructures and a plurality of second channel nanostructures in an n-type device region and a p-type device region of a substrate, respectively, and sequentially depositing a gate dielectric layer, an n-type work function metal layer, and a cap layer surrounding each of the first and second channel nanostructures. The cap layer merges in first spaces between adjacent first channel nanostructures and merges in second spaces between adjacent second channel nanostructures. The method further includes selectively removing the cap layer and the n-type work function metal layer in the p-type device region, and depositing a p-type work function metal layer over the cap layer in the n-type device region and the gate dielectric layer in the p-type device region. The p-type work function metal layer merges in the second spaces.

20 Claims, 29 Drawing Sheets

(51) Int. Cl.

| | |
|---|---|
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ....... *H10D 30/6757* (2025.01); *H10D 62/121* (2025.01); *H10D 64/017* (2025.01)

(58) Field of Classification Search
CPC .. H10D 64/017; H10D 30/797; H10D 64/667; H10D 62/82; H10D 62/822; H10D 84/0177; H10D 84/038; H10D 84/85; B82Y 10/00; H01L 21/28088

USPC ........................................................ 257/369
See application file for complete search history.

(56) References Cited

U.S. PATENT DOCUMENTS

| | | | |
|---|---|---|---|
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2020/0035678 A1 | 1/2020 | Lee et al. | |
| 2020/0328213 A1* | 10/2020 | Cheng | H10D 30/6757 |

\* cited by examiner

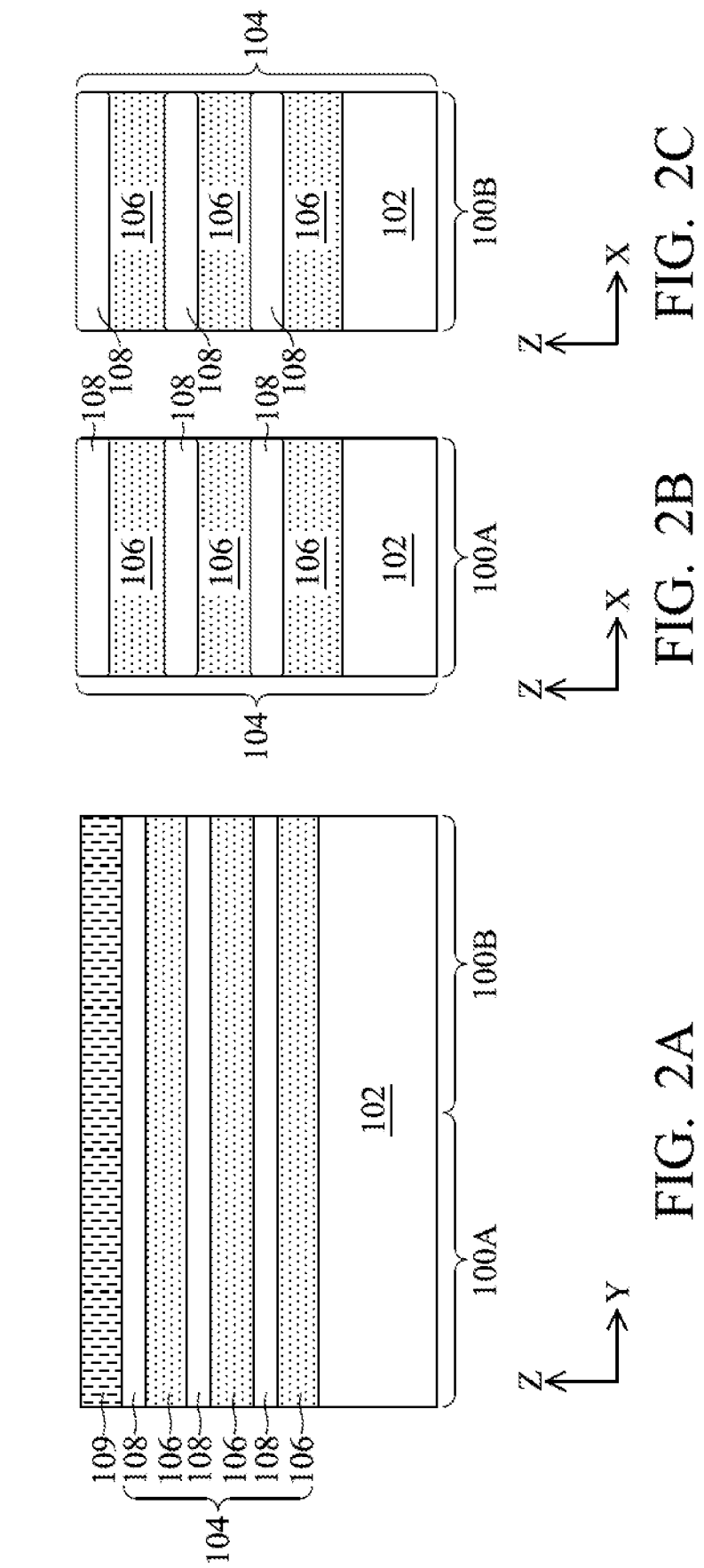

MULTIPLE GATE PATTERNING METHODS TOWARDS FUTURE NANOSHEET SCALING

PRIORITY CLAIM AND CROSS-REFERENCE

This application claims benefit of U.S. Provisional Patent Application No. 63/408,781 filed Sep. 21, 2022, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-19C are cross-sectional views of a semiconductor device at various stages of an exemplary method for fabricating a semiconductor device, in accordance with some embodiments.

FIGS. 21A-29C are cross-sectional views of a semiconductor device at various stages of an exemplary method for fabricating a semiconductor device, in accordance with some embodiments.

DETAILED DESCRIPTION

Figure 1:
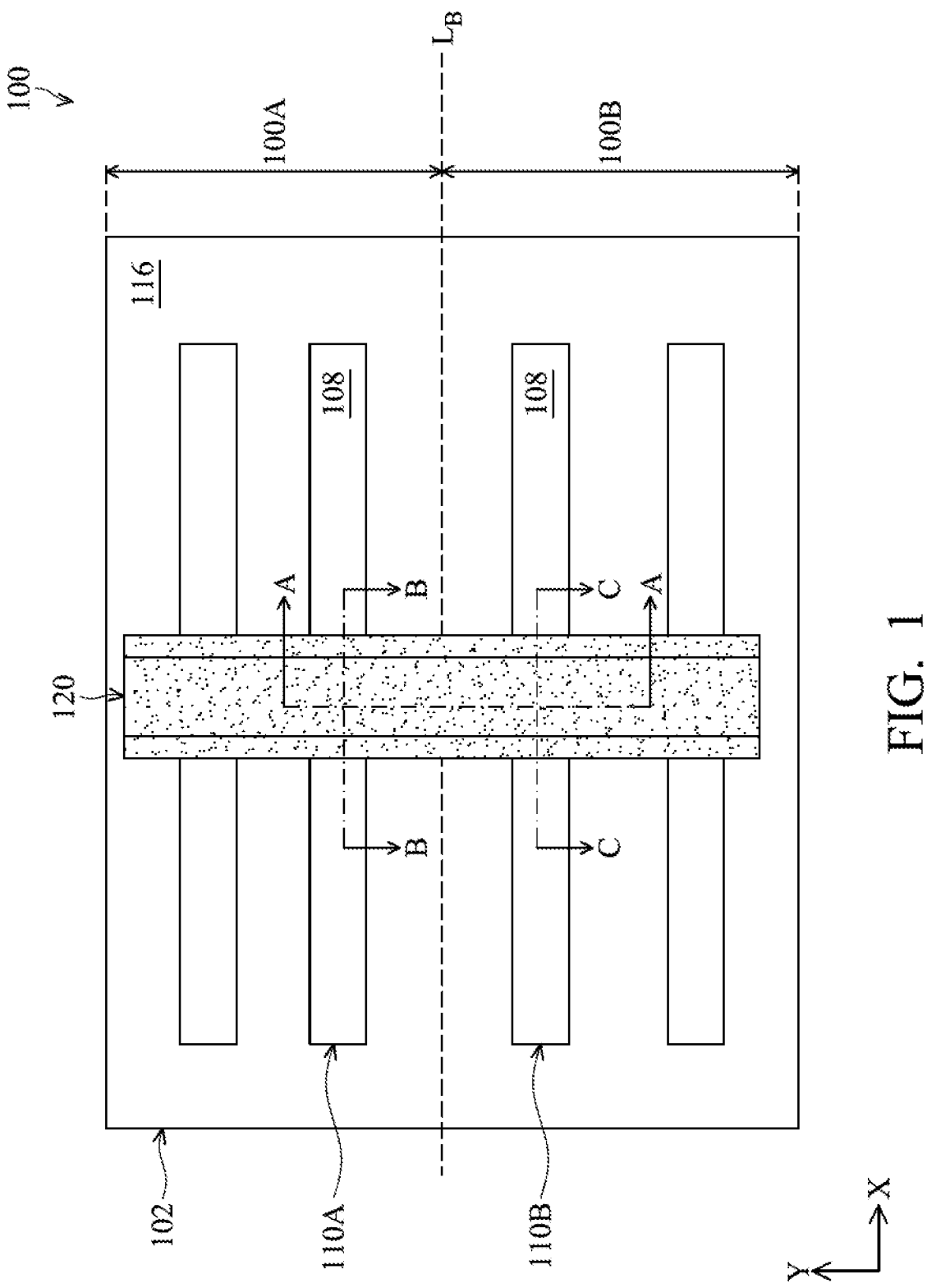
FIG. 1 is a top view of a semiconductor device at one stage of an exemplary method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As IC technologies progress towards smaller technology nodes, multigate devices such as gate-all-around (GAA) devices have been introduced to improve gate control by increasing gate-channel coupling, reducing off-state current, and reducing short-channel effects (SCEs). GAA architectures enable aggressive device density increase by scaling down standard cell heights and gate pitches. However, shrinkage of device dimensions is accompanied with processing limitations due to a tightened process window. For example, when fabricating GAA transistors with multiple threshold voltages (Vts), one or more metal gate layers may be blanketly deposited over all channel regions and selectively removed from a subset of the channel regions. However, patterning metal gate layers (also referred to as "metal gate patterning") to enable multiple Vts is quite challenging for GAA devices because of the narrow space between adjacent GAA channels and small gate pitch. When a wet over-etching is applied to ensure complete removal of the metal gate material in one region, the metal gate material in another neighboring region may suffer loss, causing Vt drift.

Embodiments disclosed herein relate to fabricating GAA transistors having a mixed-Vts boundary of multiple patterning gates (MPGs) by an n-type metal gate patterning-first process. The embodiments of the present disclosure can avoid lateral removal of the n-type metal gate in the NFET region by a wet etching process, and thereby avoid metal gate material loss and eliminate Vt variation due to the metal gate damage. Moreover, cell height and gate pitch budgets can be saved due to minimized lateral metal gate material loss.

The GAA transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structures.

FIGS. 1-19C are fragmentary views of a semiconductor device 100 at various fabrication stages according to various aspects of the present disclosure. In particular, FIG. 1 is a top view of the semiconductor device 100 in an X-Y plane, FIGS. 2A, 3A, 4A, 5A, 6A, 7A, 8A, 9A, 10A, 11A, 12A, 13A, 14A, 15A, 16A, 17A, 18A and 19A are cross-sectional views of the semiconductor device 100 in a Y-Z plane along line A-A of FIG. 1, FIGS. 2B, 3B, 4B, 5B, 6B, 7B, 8B, 9B, 10B, 11B, 12B, 13B, 14B, 15B, 16B, 17B, 18B and 19B are cross-sectional views of the semiconductor device 100 in an X-Z plane along line B-B of FIG. 1, and FIGS. 2C, 3C, 4C, 5C, 6C, 7C, 8C, 9C, 10C, 11C, 12C, 13C, 14C, 15C, 16C, 17C, 18C and 19C are cross-sectional views of the semiconductor device 100 in an X-Z plane along line C-C of FIG. 1. FIGS. 1-19C have been simplified for the sake of clarity to better understand the inventive concepts of the present disclosure. Additional features can be added in the semiconductor device 100, and some of the features described below can be replaced, modified, or eliminated in other embodiments of the semiconductor device 100.

FIG. 1 is a top view of a structure at one stage of an exemplary method for fabricating a semiconductor device 100, in accordance with some embodiments. At the stage, the semiconductor device 100 includes a sacrificial gate structure 120 formed on and across multiple fin structures 110A in an n-type device region such as an n-type FET (NFET) region 100A and multiple fin structures 110B in a p-type device region such as a p-type FET (PFET) region 100B. A boundary $L_B$ is located between the NFET region 100A and the PFET region 100B. Each of the fin structures 110A and 110B is surrounded and isolated by an isolation structure 116 such as a shallow trench isolation (STI) structure. The fin structures 110A and 110B, the sacrificial gate structure 120 and the isolation structures 116 are formed on a substrate 102. Line A-A is parallel to the sacrificial gate structure 120 and across the fin structure 110A and the fin structure 110B. Line B-B is perpendicular to the sacrificial gate structure 120 and runs along a lengthwise direction of the fin structure 110A in the NFET region 100A. Line C-C is perpendicular to the sacrificial gate structure 120 and runs along a lengthwise direction of the fin structure 110B in the PFET region 100B.

Referring to FIGS. 2A-2C, a stack 104 of semiconductor layers are blanketly deposited on the substrate 102, in accordance with some embodiments.

The substrate 102 can be any suitable substrate, and can be processed with various features. In some embodiments, the substrate 102 may be a semiconductor substrate such as a silicon substrate. In some embodiments, the substrate 102 includes various layers, including conductive or insulating layers formed on a semiconductor substrate. The substrate 102 may include various doping configurations. For example, different doping profiles (e.g., n wells, p wells) may be formed on the substrate 102 in regions designed for different device types (e.g., n-type FETs, p-type FETs). The suitable doping may include ion implantation of dopants and/or diffusion processes. The substrate 102 typically has isolation features (e.g., shallow trench isolation (STI) features) interposing the regions providing different device types. The substrate 102 includes other semiconductors such as germanium or diamond. Alternatively, the substrate 102 includes a compound semiconductor such as silicon carbide (SiC), gallium arsenic, gallium phosphide, indium phosphide, indium arsenide, indium antimonide; an alloy semiconductor, such as SiGe, GaAsP, AlInAs, AlGaAs, GaInAs, GaInP, GaInAsP, and/or other suitable materials. Further, the substrate 102 may optionally include an epitaxial layer, may be strained for performance enhancement, may include a silicon-on-insulator structure, and/or have other suitable enhancement features.

The stack 104 includes semiconductor layers 106 and 108 that are arranged in an alternating order. In some embodiments, the semiconductor layers 106 include a first semiconductor material, and the semiconductor layers 108 include a second semiconductor material that is different from the first semiconductor material. The materials of the semiconductor layers 106 and 108 may be chosen based on providing different etching selectivities. For example, in some embodiments, the first semiconductor material may comprise germanium (Ge) or silicon germanium (SiGe), whereas the second semiconductor material may comprise silicon (Si). In some alternative embodiments, the first semiconductor material includes SiGe having a first Ge content and the second semiconductor material includes SiGe having a second Ge content lower than the first Ge content. In various embodiments, the semiconductor layers 106 and 108 are substantially dopant-free (i.e., having an extrinsic dopant concentration less than about $1 \times 10^{17}$ cm$^{-3}$).

In some embodiments, the semiconductor layers 106 may be removed in later process, thereby leaving the semiconductor layers 108 which define channel nanostructures (e.g., 156A and 156B of FIGS. 13A-13C) for the semiconductor device 100. In this regard, the semiconductor layers 106 function as sacrificial semiconductor layers. The thickness of semiconductor layers 106 thus determines the spacing between adjacent channel nanostructures (e.g., 156A and 156B of FIGS. 13A-13C). In some embodiments, the thickness of the semiconductor layers 106 may range from about 9 nm to about 12 nm. The thickness of the semiconductor layers 108 is chosen based on, for example, manufacturing considerations, transistor performance considerations, and the like. In some embodiments, the thickness of the semiconductor layers 108 may range from about 4 nm to about 8 nm.

The number of semiconductor layers 106 and 108 depends on the desired number of channel nanostructures (e.g., 156A and 156B of FIGS. 13A-13C) in the semiconductor device 100. In some embodiments, the number of semiconductor layers 108 is from, for example, 2 to 10, to form a stack of 2 to 10 vertically separated channel nanostructures. In some embodiments and as illustrated in FIG. 2, the stack 104 includes three (3) layers of semiconductor layers 106 and three (3) layers of semiconductor layers 108.

In some embodiments, the semiconductor layers 106 and 108 are epitaxially grown layer-by-layer from a top surface of the substrate 102. For example, in some embodiments, the semiconductor layers 106 and 108 are grown by a molecular beam epitaxy (MBE) process, a chemical vapor deposition (CVD) process such as a metal organic CVD (MOCVD) process, or other suitable epitaxial growth processes. The epitaxial growth results in the semiconductor layers 106 and 108 having the same crystal orientation as the substrate 102. In some embodiments, the semiconductor layer 106 may be firstly deposited on the substrate 102. Alternatively, the semiconductor layer 108 may be firstly deposited on the substrate 102.

As also shown in FIGS. 2A-2C, a hard mask layer 109 is formed over the stack 104. In some embodiments, the hard mask layer 109 includes a dielectric material such as, for example, silicon nitride (SiN), silicon carbon nitride (SiCN), silicon oxycarbide (SiOC), silicon oxycarbon nitride (SiOCN), or a combination thereof. In some embodiments, the hard mask layer 109 is formed by chemical CVD, plasma enhanced CVD (PECVD), physical vapor deposition (PVD), atomic layer deposition (ALD), or other suitable deposition processes. In some embodiments, the hard mask layer 109 may have a double-layer structure including a pad oxide layer and a pad nitride layer formed over the pad oxide layer. In some embodiments, the pad oxide layer includes silicon oxide, which can be formed by thermal oxidation. The pad nitride layer includes SiN, which can be formed by CVD, PECVD, PVD, ALD, or other suitable deposition processes. The hard mask layer 109 is used to protect portions of the substrate 102 and the stack 104 and is used to define a pattern (e.g., fins) as described below.

Figures 3A, 3B, 3C:
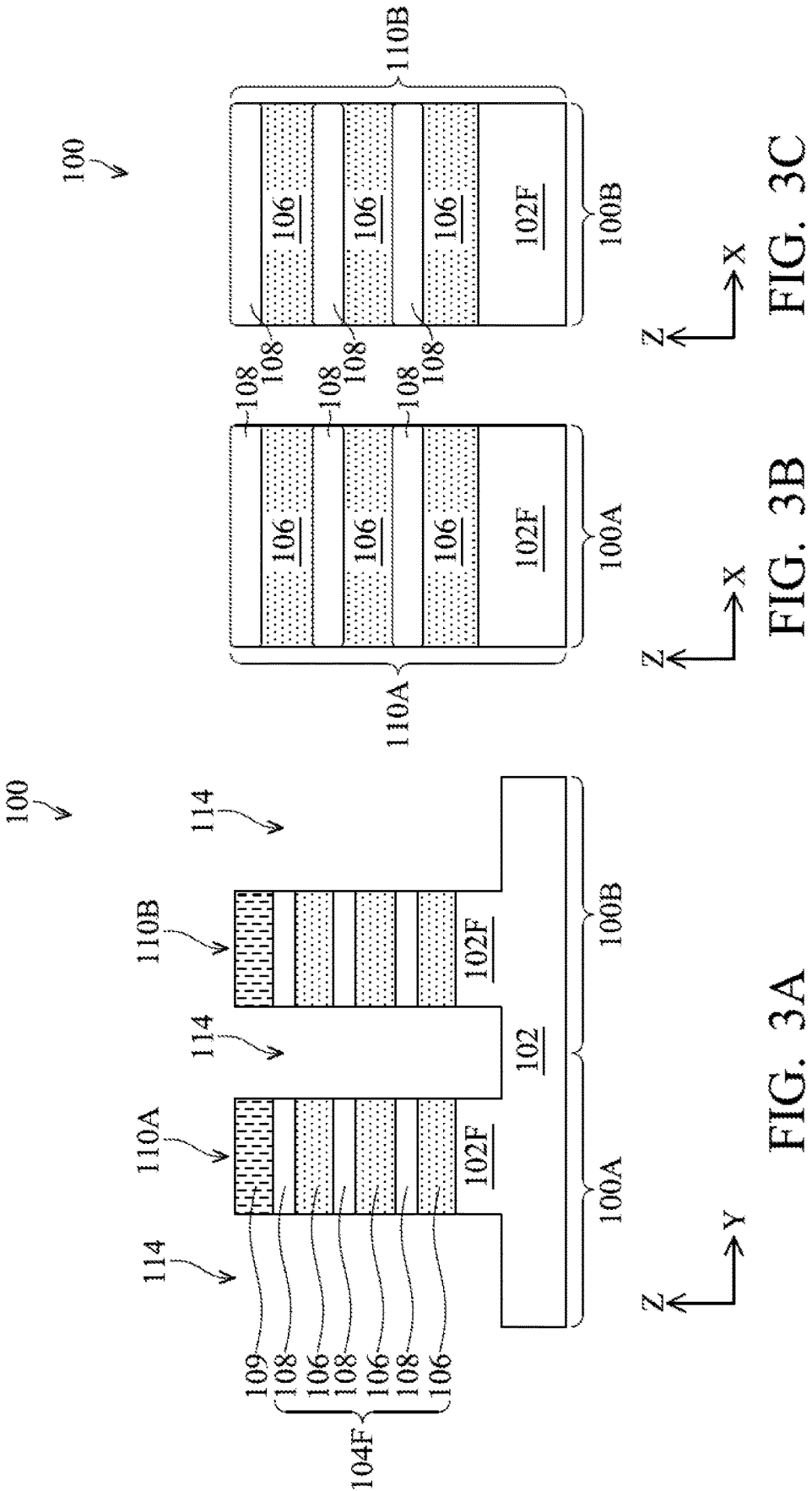

Turning to FIGS. 3A-3C, the substrate 102 and the stack 104 are patterned to form fin structures 110A in the NFET region 100A and fin structures 110B in the PFET region 100B, in accordance with some embodiments.

The fin structures 110A and 110B protrude upwards from the substrate 102 in Z-direction. In various embodiments, each of the fin structures 110A and 110B includes a fin base 102F and a semiconductor stack portion 104F on the fin base 102F. The fin base 102F is formed from the substrate 102, while the semiconductor stack portion 104F is formed from the stack 104 and includes portions of the semiconductor layers 106 and 108.

In some embodiments, the fin structures 110A and 110B are fabricated using suitable processes including photolithography and etch processes. During a photolithography process, a photoresist layer is first applied to the hard mask layer 109 by, for example, spin coating. Then, the photoresist layer is exposed according to a mask of patterns, and is developed to form the patterns in the photoresist layer. The photoresist layer with the patterns can be used as an etch mask to pattern other layers. In some embodiments, patterning the photoresist layer is performed using an extreme ultraviolet (EUV) light lithography process. The patterned photoresist layer is then used to protect regions of the substrate 102 and semiconductor layers 106 and 108 formed thereupon, while an etching process forms trenches 114 in unprotected regions through the hard mask layer 109 and the stack 104, and into the substrate 102. Each of the trenches 114 is between neighboring pairs of fin structures 110A or 110B, or between neighboring fin structures 110A and 110B. In some embodiments, the etching process may be a dry etching process such as plasma etching or reactive ion etching (RIE), a wet etching process, or a combination thereof.

In various other embodiments, the fin structures 110A and 110B may be formed by any suitable methods. For example, the fin structures 110A and 110B may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Mandrels are formed alongside the patterned sacrificial layer using a self-aligned process. The sacrificial layer is then removed, and the remaining mandrels then used to as an etch mask to pattern the stack 104 and the substrate 102 to provide the fin structures 110A and 110B.

Figures 4A, 4B, 4C:
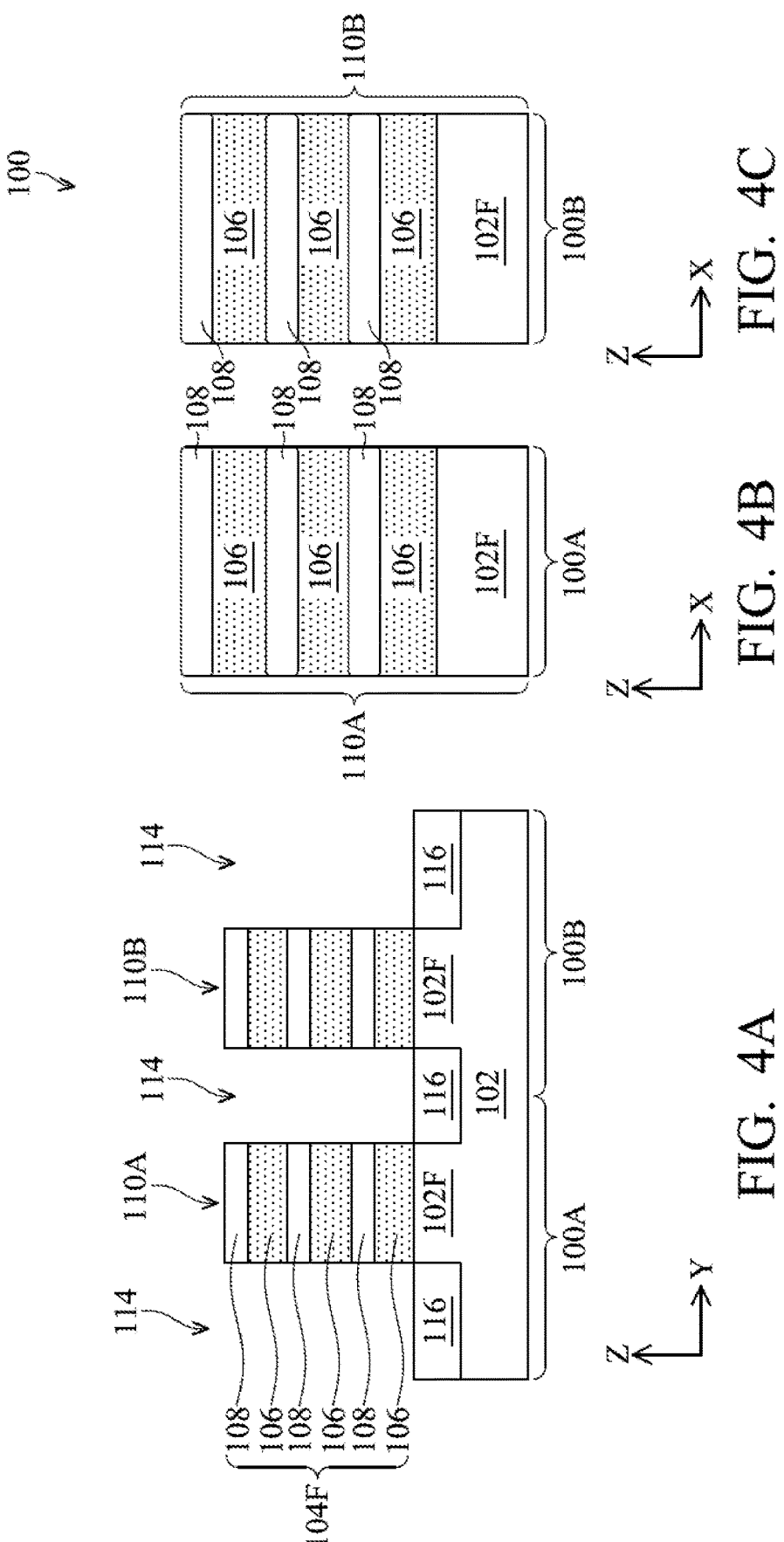

Turning to FIGS. 4A-4C, isolation structures 116 are formed in the trenches 114, in accordance with some embodiments.

The isolation structures 116, which may be STI structures, are formed adjacent and between the fin structures 110A and 110B. The isolation structures 116 may include one or more dielectric materials such as silicon oxide, silicon nitride, silicon oxynitride, or combinations thereof. The dielectric material may be deposited by any suitable deposition processes, such as CVD, PECVD, or PVD, to fill the trenches 114. After the deposition process, a planarization process such as a chemical mechanical polishing (CMP) process may be performed on the deposited dielectric material to remove the dielectric material from the top surface of the hard mask layer 109 so that the deposited dielectric material may be coplanar with the hard mask layer 109. The deposited dielectric material may then be recessed. In some embodiments, the recessing process may include a dry etching process, a wet etching process, or a combination thereof. In some embodiments, the recessing depth is controlled (e.g., by controlling an etching time) so as to result in a desired height of the exposed upper portions of the fin structures 110A and 110B. In some embodiments, after recessing, the top surfaces of the isolation structures 116 may be lower than or level with the top surface of the fin base 102F so that the recessing exposes each of the semiconductor layers 106 and 108 in the semiconductor stack portion 104F.

The hard mask layer 109 may also be removed before, during, and/or after recessing of the deposited dielectric material. In some embodiments, the hard mask layer 109 may be removed by a CMP process performed prior to recessing of the deposited dielectric material. In some embodiments, the hard mask layer 109 may be removed by the etchant used to recess the deposited dielectric material.

Figures 5A, 5B, 5C:
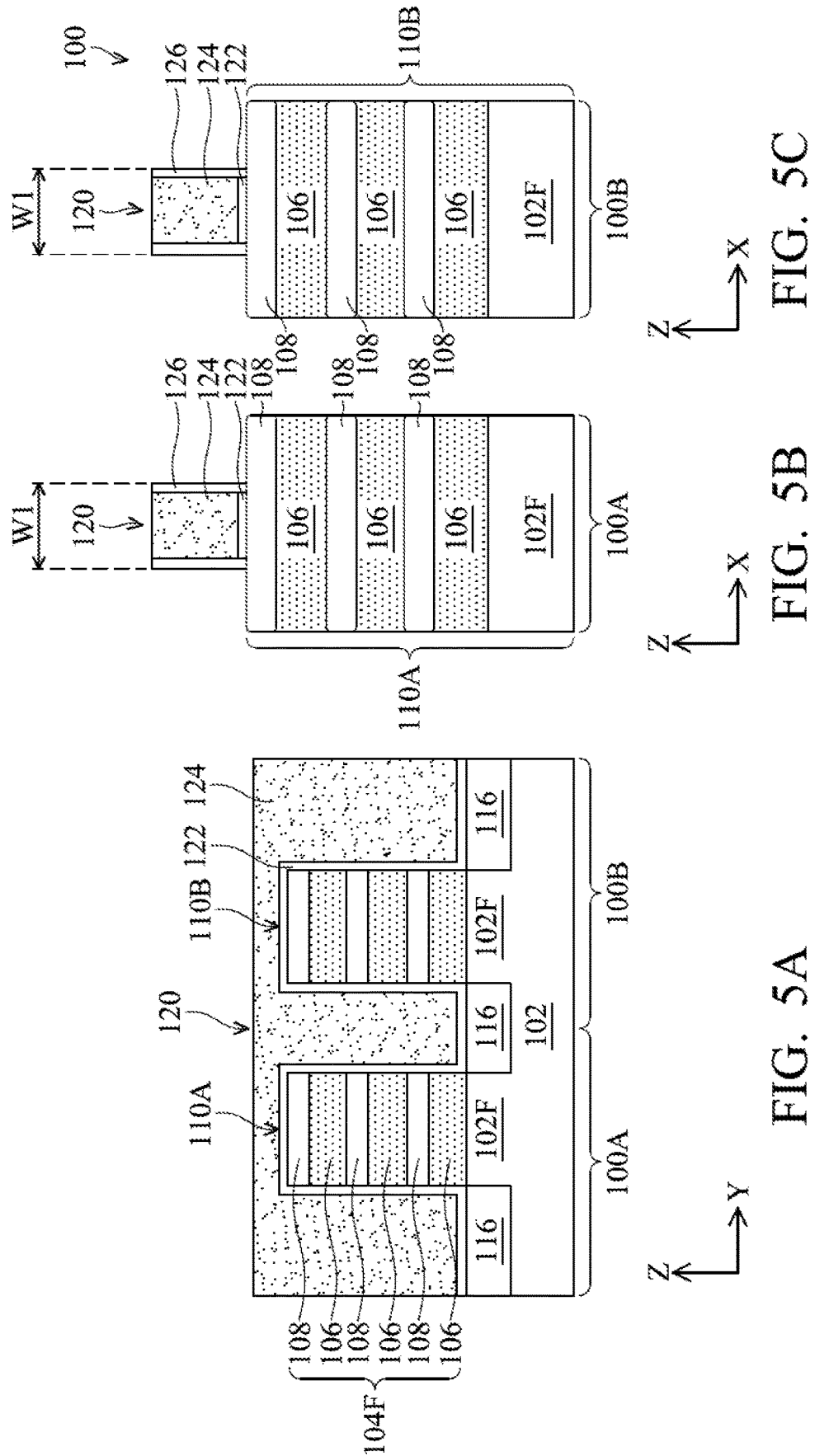

Referring to FIGS. 5A-5C, the sacrificial gate structure 120 is formed across the fin structures 110A and 110B, along the sidewalls and over the top surfaces of the fin structures 110A and 110B, in accordance with some embodiments.

The sacrificial gate structure 120 includes a sacrificial gate stack (122, 124) and gate spacers 126. Accordance to embodiments of the present disclosure, the sacrificial gate stack (122, 124) will be replaced with a metal gate stack. The width (w1) of the sacrificial gate stack (122, 124) thus determines a gate length (Lg) of the metal gate stack subsequently formed. In some embodiments, the width w1 of the sacrificial gate stack (122, 124) may range from about 10 nm to about 18 nm.

In some embodiments, the sacrificial gate stack (122, 124) includes a sacrificial gate dielectric 122 and a sacrificial gate electrode 124 on the sacrificial gate dielectric 122. In some embodiments, the sacrificial gate stack (122, 124) may further include a sacrificial gate cap (not shown) on top of the sacrificial gate electrode 124.

In some embodiments, the sacrificial gate dielectric 122 may be made of silicon oxide, silicon nitride, or silicon oxynitride. The sacrificial gate electrode 124 may be made of silicon such as polycrystalline silicon or amorphous silicon. In some embodiments, the sacrificial gate stack (122, 124) may be formed by first blanketly depositing a sacrificial gate dielectric layer over the semiconductor stack portions 104F and the isolation structures 116. A sacrificial gate electrode layer is then blanketly deposited on the sacrificial gate dielectric layer such that the fin structures 110A and 110B are fully embedded in the sacrificial gate electrode layer. The thickness of the sacrificial gate dielectric layer may range from about 1 nm to about 5 nm in some embodiments. The thickness of the sacrificial gate electrode layer may range from about 100 nm to about 200 nm in some embodiments. In some embodiments, the sacrificial gate electrode layer is subjected to a planarization operation. The sacrificial gate dielectric layer and the sacrificial gate electrode layer may be deposited using CVD, PECVD, PVD, ALD, or other suitable deposition processes. Subsequently, the sacrificial gate dielectric layer and the sacrificial gate electrode layer are patterned using photolithography and etching processes. For example, a photoresist layer (not shown) is applied over the sacrificial electrode layer and lithographically patterned by lithographic exposure and development. The pattern in the photoresist layer is sequentially transferred into the sacrificial electrode layer and the sacrificial dielectric layer by at least one anisotropic etching process, thereby forming the sacrificial gate stack (122, 124). The anisotropic etching process may be a dry etching process, for example, RIE, a wet etching process, or a combination thereof. If not completely consumed, the remaining photoresist layer after formation of the sacrificial gate stack (122, 124) is removed by, for example, ashing.

The gate spacers 126 are disposed along sidewalls of the sacrificial gate stack (122, 124). In some embodiments, the gate spacers 126 may include a dielectric material such as, for example, an oxide, a nitride, an oxynitride, or combinations thereof. In some embodiments, the gate spacers 126 are made of silicon nitride. In some embodiments, the gate spacers 126 may be formed by first depositing a conformal gate spacer material layer on exposed surfaces of the sacrificial gate stack (122, 124), the fin structures 110A and 110B, and the isolation structures 116 and then etching the gate spacer material layer to remove horizontal portions of the gate spacer material layer. In some embodiments, the gate spacer material layer may be deposited, for example, by CVD, PECVD, or ALD. In some embodiments, the gate spacer material layer may be etched by dry etch such as, for example, plasma etching or RIE. Vertical portions of the gate spacer material layer present on the sidewalls of sacrificial gate stack (122, 124) constitute the gate spacers 126.

Figures 6A, 6B, 6C:
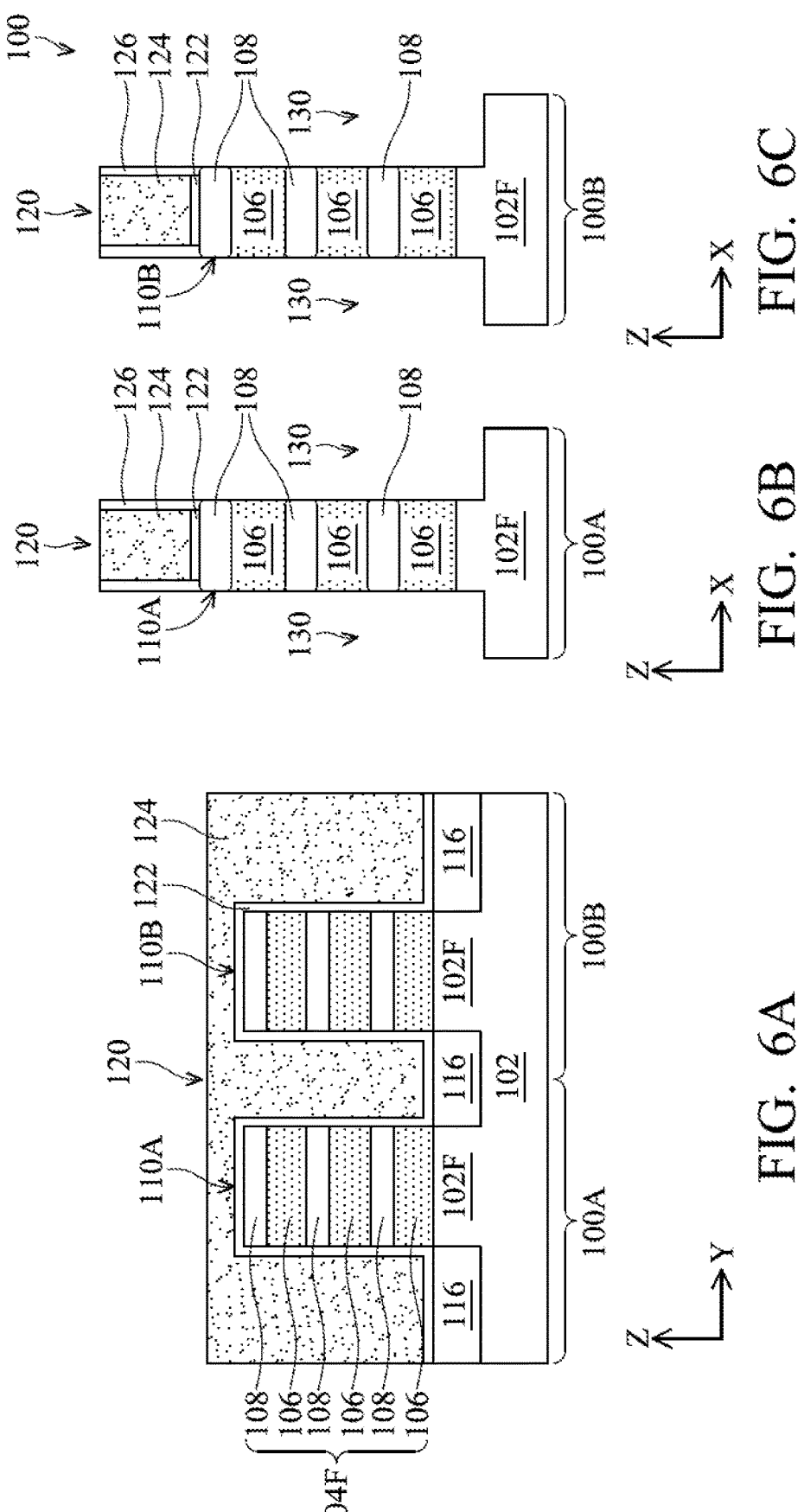

Turning to FIGS. 6A-6C, the semiconductor layers 106 and 108 of the fin structures 110A and 110B at the source/drain regions are etched using the sacrificial gate structure 120 as an etch mask to form recesses 130, in accordance with some embodiments.

The recesses 130 may be formed using an anisotropic etching process that removes the portions of the fin structures 110A and 110B not covered by the sacrificial gate structure 120. In some embodiments, the anisotropic etching process may be a dry etching process such as plasma etching or RIE. Alternatively, the anisotropic etching process may be a wet etching process that uses an etchant such as ammonium hydroxide-hydrogen peroxide water mixture (APM), tetramethylammonium hydroxide (TMAH), or ammonium hydroxide (NH$_4$OH). In some embodiments, the substrate 102 may also be partially etched. Accordingly, the bottom surfaces of the recesses 130 may be leveled with the top surface of the fin base 102F or lower than the top surface of the fin base 102F.

Figures 7A, 7B, 7C:
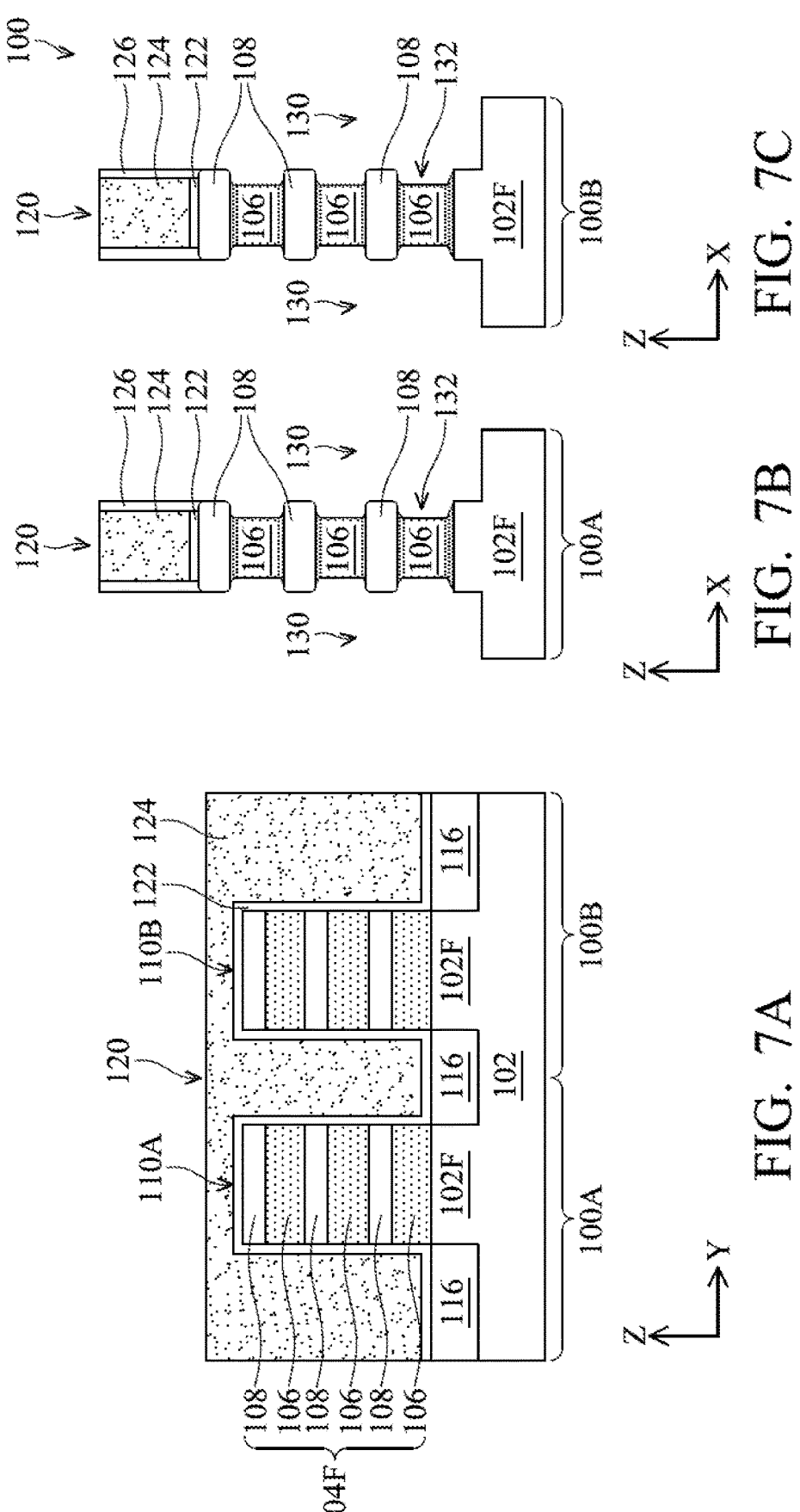

Turning to FIGS. 7A-7C, the semiconductor layers 106 of the fin structures 110A and 110B are laterally etched to form cavities 132, in accordance with some embodiments.

The cavities 132 are formed between the semiconductor layers 108 and beneath the gate spacers 126. A wet etching process may be performed to selectively remove the portions of the semiconductor layers 106 that underlie the gate spacers 126. In some embodiments, the amount of the semiconductor layers 106 etched is controlled so that the lateral etching distance is no greater than the width of the gate spacers 126. Depending on the materials forming the semiconductor layers 106 and 108, the wet etching process may use an etchant such as, but not limited to, ammonium hydroxide (NH$_4$OH), tetramethylammonium hydroxide (TMAH), ethylenediamine pyrocatechol (EDP), or potassium hydroxide (KOH) solutions. Alternatively, lateral ends of the semiconductor layers 106 that are exposed in the recesses 130 may be first selectively oxidized to increase the etching selectivity between the semiconductor layers 106 and the semiconductor layer 108. In some embodiments, the oxidation process may be performed by exposing the semiconductor device 100 to a wet oxidation process, a dry oxidation process, or a combination thereof.

Figures 8A, 8B, 8C:
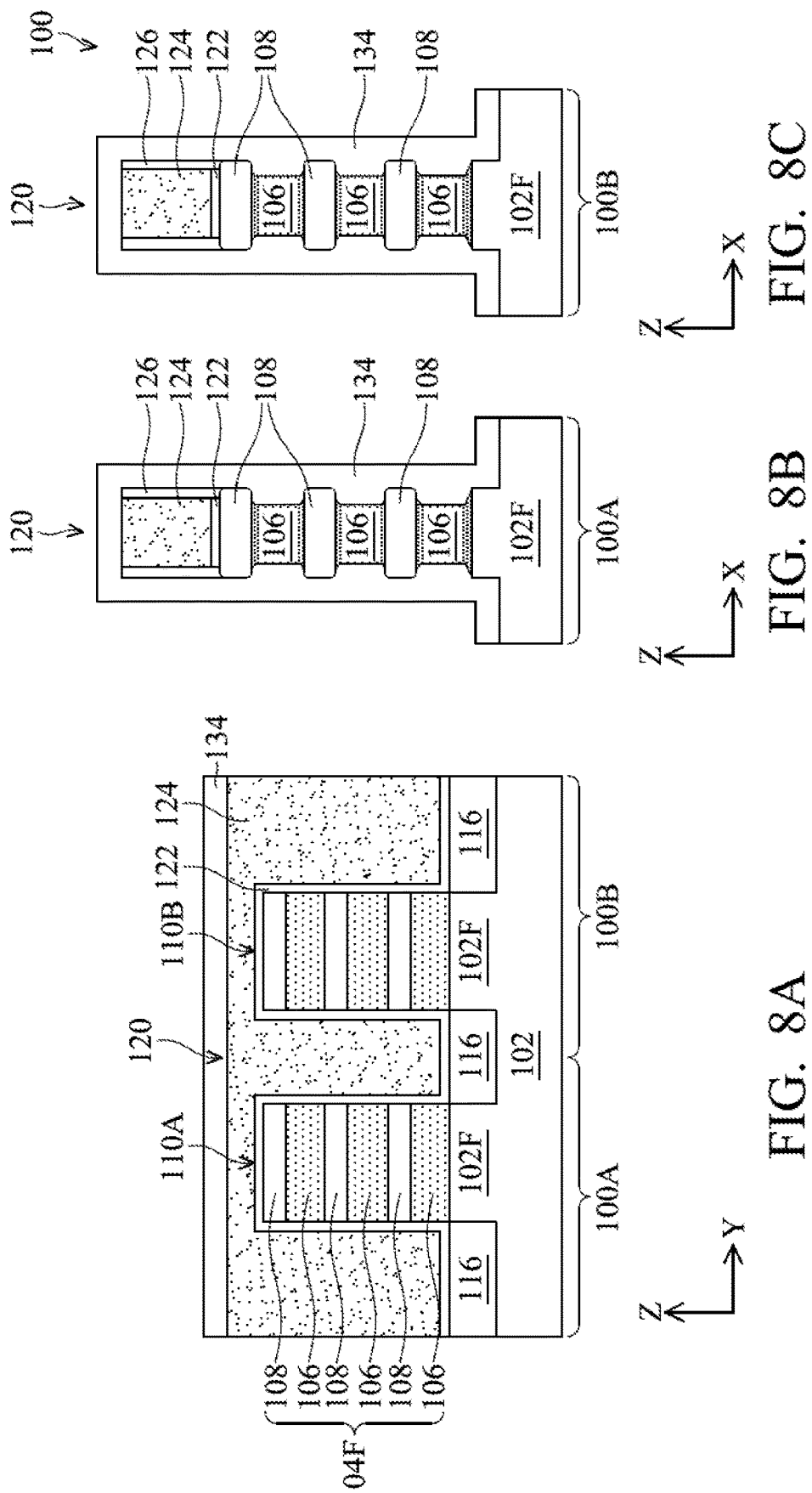

Turning to FIGS. 8A-8C, an inner spacer layer 134 is formed along exposed surfaces of the substrate 102, the semiconductor layers 106 and 108, and the sacrificial gate structure 120, in accordance with some embodiments.

In some embodiments, the inner spacer layer 134 is a conformal dielectric layer formed on the lateral ends of the semiconductor layers 106 and 108 to fill the cavities 132. The inner spacer layer 134 may include silicon oxides, silicon nitrides, silicon carbides, silicon carbide nitride, silicon oxide carbide, silicon carbide oxynitride, and/or other suitable dielectric materials. The inner spacer layer 134 may be formed by CVD, ALD or any other suitable deposition processes. In some embodiments, the inner spacer layer 134 may be formed to have a thickness such that the cavities 132 are completely filled by the inner spacer layer 134.

Figures 9A, 9B, 9C:
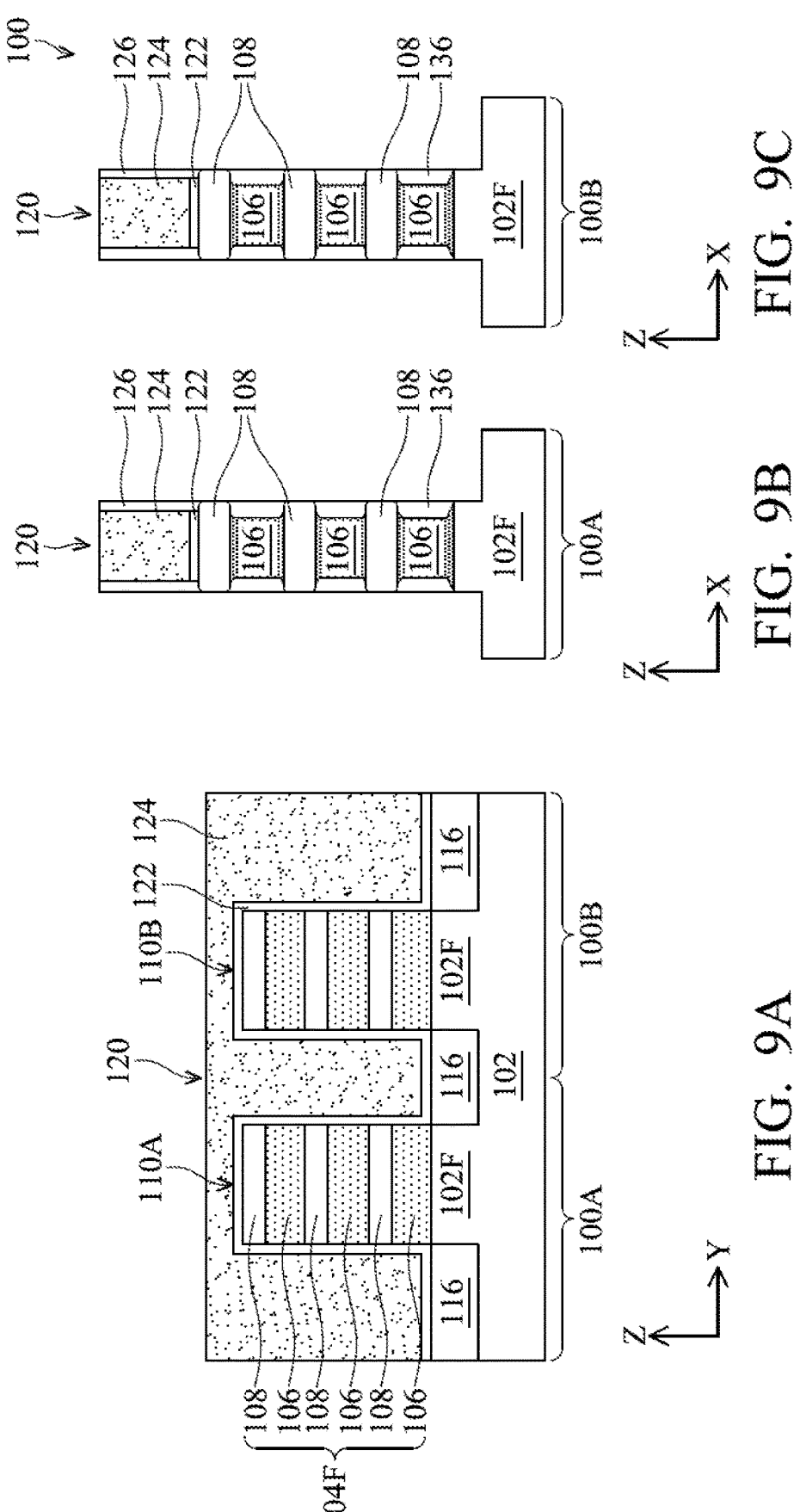

Turning to FIGS. 9A-9C, inner spacers 136 are formed in the cavities 132, in accordance with some embodiments.

The inner spacers 136 fill the cavities 132, contacting end surfaces of the semiconductor layers 106. An etching process is performed to remove the portions of the inner spacer layer 134 from the sidewalls of the semiconductor layer 108. Portions of the inner spacer layer 134 remained in the cavities 132 constitute the inner spacers 136. In some embodiments, a wet etching process is performed using an etchant such as, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figures 10A, 10B, 10C:
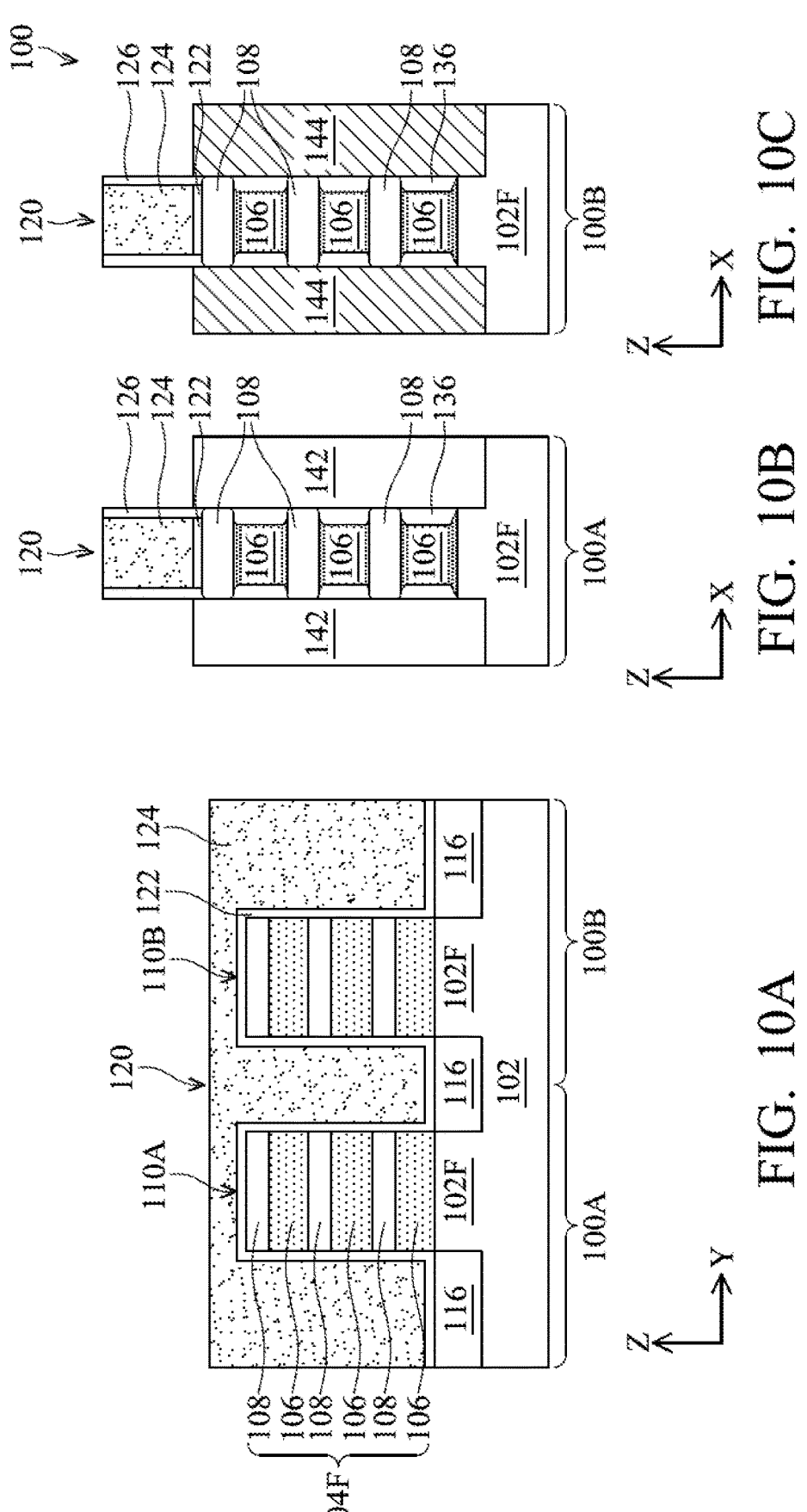

Turning to FIGS. 10A-10C, source/drain regions 142 are formed in the recesses 130 in the NFET region 100A and source/drain regions 144 are formed in the recesses 130 in the PFET region 100B, in accordance with some embodiments. Source/drain region(s) may refer to a source or a drain, individually or collectively dependent upon the context.

In the NFET region 100A, the source/drain regions 142 are disposed on opposite sides of the sacrificial gate structure 120 and the semiconductor layers 106 and 108 such that the source/drain regions 142 are in contact with the semiconductor layers 108 but are separated from the semiconductor layers 106 by the inner spacers 136. In the PFET region 100B, the source/drain regions 144 are disposed on opposite sides of the sacrificial gate structure 120 and the semiconductor layers 106 and 108 such that the source/drain regions 144 are in contact with the semiconductor layers 108 but are separated from the semiconductor layers 106 by the inner spacers 136.

In some embodiments, the source/drain regions 142 in the NFET region 100A include an n-doped semiconductor material for n-type FETs. The source/drain regions 144 in the PFET region 100B include a p-doped semiconductor material for p-type FETs. The source/drain regions 142 in the NFET region 100A and the source/drain regions 144 in the PFET region 100B may include the same or different semiconductor materials. Exemplary semiconductor materials include, but are not limited to, silicon germanium (SiGe), silicon carbide (SiC), silicon phosphorus, germanium, an III-V compound semiconductor, and an II-VI compound semiconductor. The materials of an III-V compound semiconductor may include InAs, AlAs, GaAs, InP, GaN, InGaAs, InAlAs, GaSb, AlSb, AlP, or GaP. In some embodiments, the source/drain regions 142 in the NFET region 100A are made of n-doped SiC, and the source/drain regions 144 in the PFET region 100B are made of p-doped SiGe.

Exemplary n-type dopants include, but are not limited to, P, As, and Sb. Exemplary p-type dopants include, but are not limited to, B, Al, Ga, and In.

The source/drain regions 142 in the NFET region 100A and the source/drain regions 144 in the PFET region 100B may be independently formed by metal-organic CVD (MOCVD), molecular beam epitaxy (MBE), liquid phase epitaxy (LPE), vapor phase epitaxy (VPE), selective epitaxial growth (SEG), or other suitable epitaxial deposition processes. The source/drain regions 142 and 144 may have several facets. In addition, the source/drain regions 142 and 144 may be independently doped by in-situ doping during the epitaxial growth of the source/drain regions 142 and 144 and/or by implantation after the epitaxial growth of the source/drain regions 142 and 144. In some instances, the top surfaces of the source/drain regions 142 and 144 may be higher than or at the same level with a top surface of a topmost semiconductor layer 108 in the semiconductor stack portion 104F.

Moreover, some of the source/drain regions 142 in the NFET region 100A may be shared between two neighboring transistors, such as through coalescing the structures by epitaxial growth. Also, some of the source/drain regions 144 in the PFET region 100B may be shared between two neighboring transistors, such as through coalescing the structures by epitaxial growth. For example, the neighboring NFETs or PFETs with the shared source/drain regions may be implemented as two functional transistors. Other configurations in other examples may implement other numbers of functional transistors. In some embodiments, the source/drain regions 142 of the neighboring NFETs may be separated from each other. Also, the source/drain regions 144 of the neighboring PFETs may be separated from each other.

Figures 11A, 11B, 11C:
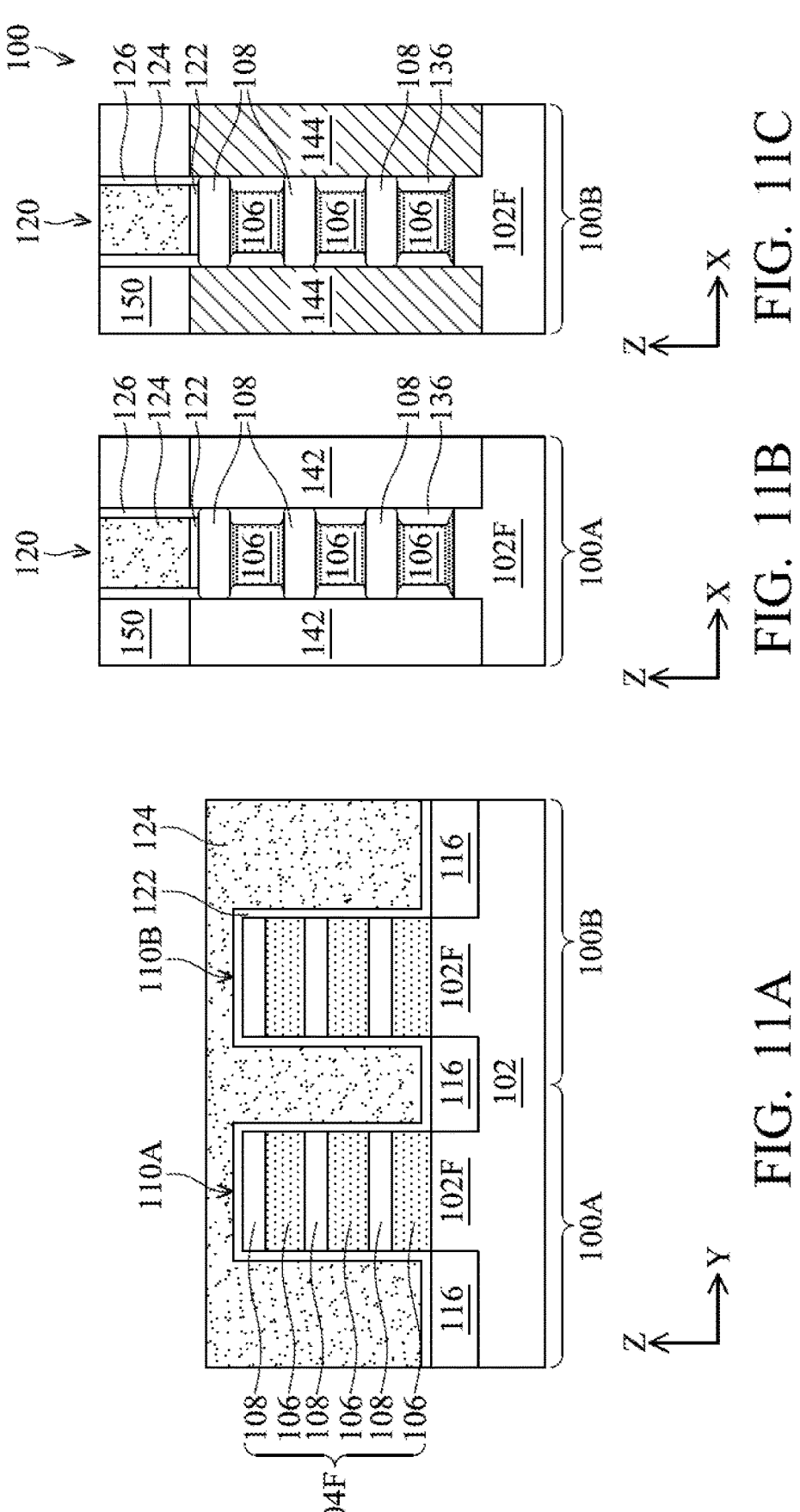

Turning to FIGS. 11A-11C, an interlayer dielectric (ILD) layer 150 is formed over the source/drain regions 142 and 144 and the isolation structures 116, in accordance with some embodiments.

In some embodiments, the ILD layer 150 may include a low-k dielectric material having a dielectric constant lower than the dielectric constant (about 3.9) of silicon dioxide. The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide ($SiO_xC_y$), spin-on-glass (SOG), or combinations thereof. The ILD layer 150 may include a multi-layer structure having multiple dielectric materials and may be formed by CVD, flowable CVD (FCVD), spin coating, or other suitable deposition processes. In some embodiments, forming the ILD layer 150 further includes performing a CMP process to planarize a top surface of the ILD layer 150, such that the sacrificial gate electrode 124 is exposed. The top surface of the ILD layer 150 may be coplanar with the top surfaces of the sacrificial gate electrode 124 and the gate spacers 126.

Figures 12A, 12B, 12C:
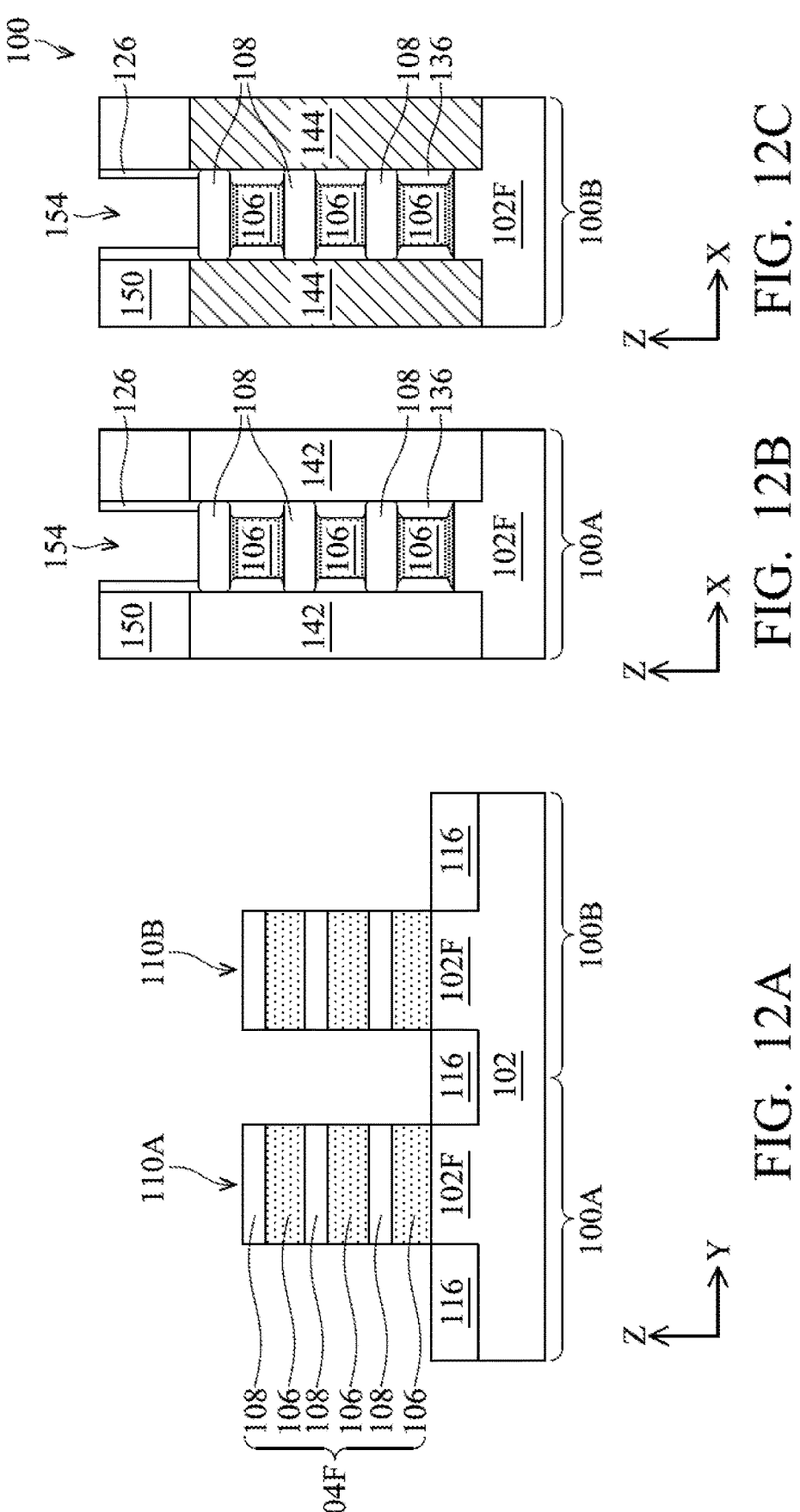

Turning to FIGS. 12A-12C, the sacrificial gate dielectric 122 and the sacrificial gate electrode 124 are removed to expose portions of the fin structures 110A and 110B, in accordance with some embodiments.

An etching process selectively removes the sacrificial gate dielectric 122 and the sacrificial gate electrode 124, thereby forming a gate trench 154 that exposes the fin structures 110A and 110B in the channel regions. The ILD layer 150 protects the source/drain regions 142 and 144 during the etching process. The etching process may be a dry etching process, a wet etching process, or a combination thereof. The etching process can be tuned such that the sacrificial gate dielectric 122 and the sacrificial gate electrode 124 are removed without (or minimally) etching other features, such as ILD layer 150, gate spacers 126, fin structures 110A and 110B, in the semiconductor device 100. For example, in instances where the sacrificial gate electrode 124 is composed of polysilicon and the ILD layer 150 is composed of silicon oxide, a wet etchant such as a TMAH solution may be used to selectively remove the sacrificial gate electrode 124. The sacrificial gate dielectric 122 is thereafter removed using plasma dry etching and/or wet etching.

Figures 13A, 13B, 13C:
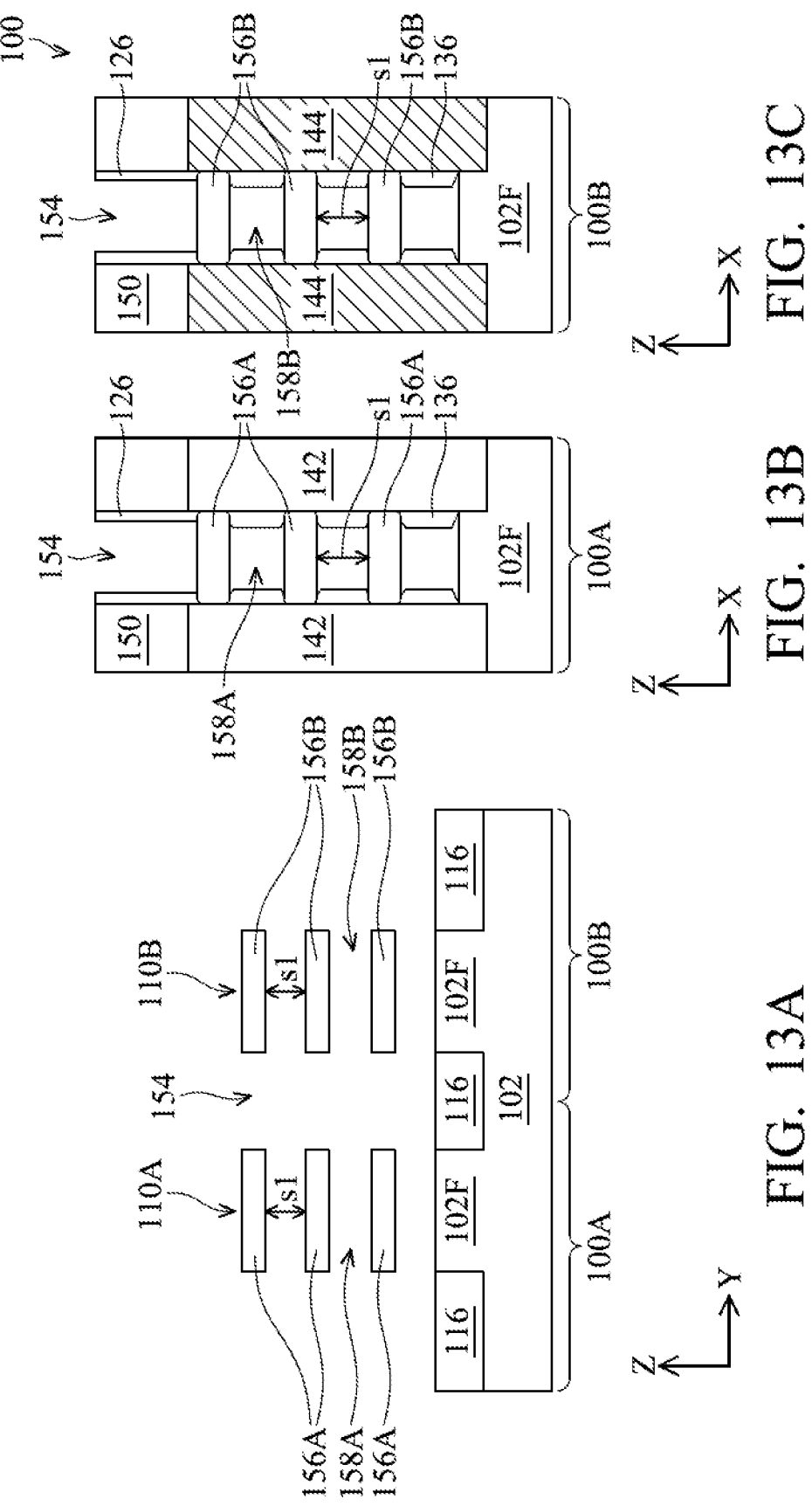

Turning to FIGS. 13A-13C, the semiconductor layers 106 are removed to form channel nanostructures 156A in the NFET region 100A and channel nanostructures 156B in the PFET region 100B, in accordance with some embodiments.

The semiconductor layers 106 may be removed by a selective etching process using an etchant that can selectively etch the semiconductor layers 106 without (or minimally) attacking the semiconductor layers 108. In some embodiments, the etching process is an isotropic etching process which can be a dry etching process or a wet etching process. In some embodiments, the selective etching process may include oxidizing the semiconductor layers 106 using a suitable oxidizer, such as ozone. Thereafter, the oxidized semiconductor layers 106 may be selectively removed. In some embodiments, when the semiconductor layers 108 include silicon (Si) and the semiconductor layers 106 include silicon germanium (SiGe), the semiconductor layers 106 may be selectively removed by applying an HCl gas at a temperature of about 500° C. to about 700° C., or applying a gas mixture of $CF_4$, $SF_6$, and $CHF_3$. The inner spacers 136 serve as etch stop layers to protect the source/drain regions 142 and 144 during removal of the semiconductor layers 106. As a result, the remaining semiconductor layers 108 form the channel nanostructures 156A in the NFET region 100A and the channel nanostructures 156B in the PFET region 100B. The channel nanostructures 156A and 156B may be nanowires or nanosheets.

The removal of the semiconductor layers 106 also forms multiple spaces 158A between adjacent channel nanostructures 156A in the NFET region 100A and multiple spaces 158B between adjacent channel nanostructures 156B in the PFET region 100B. The spaces 158A and 158B define spacing s1 between adjacent channel nanostructures 156A and 156B, respectively. In some embodiments, the spacing s1 between the adjacent channel nanostructures 156A and 156B may be from about 9 nm to about 12 nm. The spacing s1 may be referred to as sheet to sheet spacing. In some embodiments, the spacing s1 is selected to guarantee that a subsequently deposited n-type metal gate layer merges between adjacent channel nanostructures 156A and 156B. In some embodiments, the spacing s1 is substantially equal to a thickness of the semiconductor layers 106. Within the context of this specification, the word "substantially" means preferably at least 90%, more preferably 95%, even more preferably 98%, and most preferably 99%.

In some embodiments, the semiconductor layers 108 may be reshaped (e.g., thinned) by a further etching process to increase the spacing s1, thereby improving the gate filling window. The reshaping may be performed by an isotropic etching process. After reshaping, the resulting channel nanostructures 156A and 156B may exhibit a dog bone shape in which middle portions of the channel nanostructures 156A and 156B are thinner than peripheral portions of the channel nanostructures 156A and 156B along the X direction.

Figures 14A, 14B, 14C:
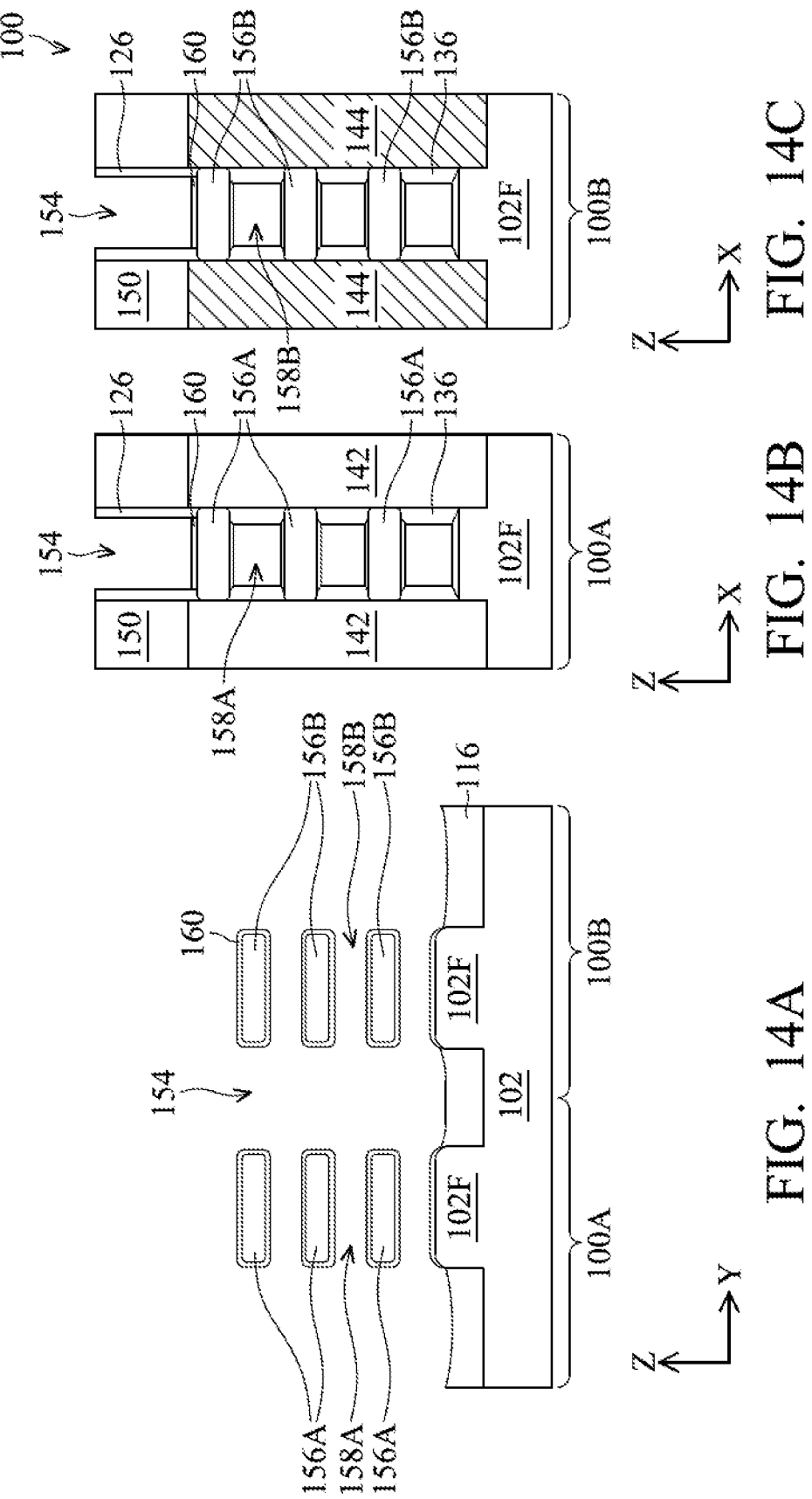

Turning to FIGS. 14A-14C, an interfacial layer 160 is formed around the channel nanostructures 156A and 156B and on the fin base 102F, in accordance with some embodiments.

The interfacial layer 160 functions to control and reduce gate leakage current and improve interfacial adhesion between a gate dielectric layer (e.g., gate dielectric layer 162 in FIGS. 15A-15C) and the channel nanostructures 156A and 156B. In some embodiments, the interfacial layer 160 may include a dielectric material such as silicon oxide. In some embodiments, the interfacial layer 160 may be formed by chemical oxidation or thermal oxidation of surface portions of the channel nanostructures 156A and 156B and substrate 102. Alternatively, in some embodiments, the interfacial layer 160 may be formed by deposition of a dielectric material using ALD, CVD, and/or other suitable deposition methods. In some embodiments, the interfacial layer 160 may be formed to have a thickness ranging from about 0.5 nm to about 1.5 nm. In some embodiments, the interfacial layer 160 may be formed to have a thickness of about 1 nm.

Figures 15A, 15B, 15C:
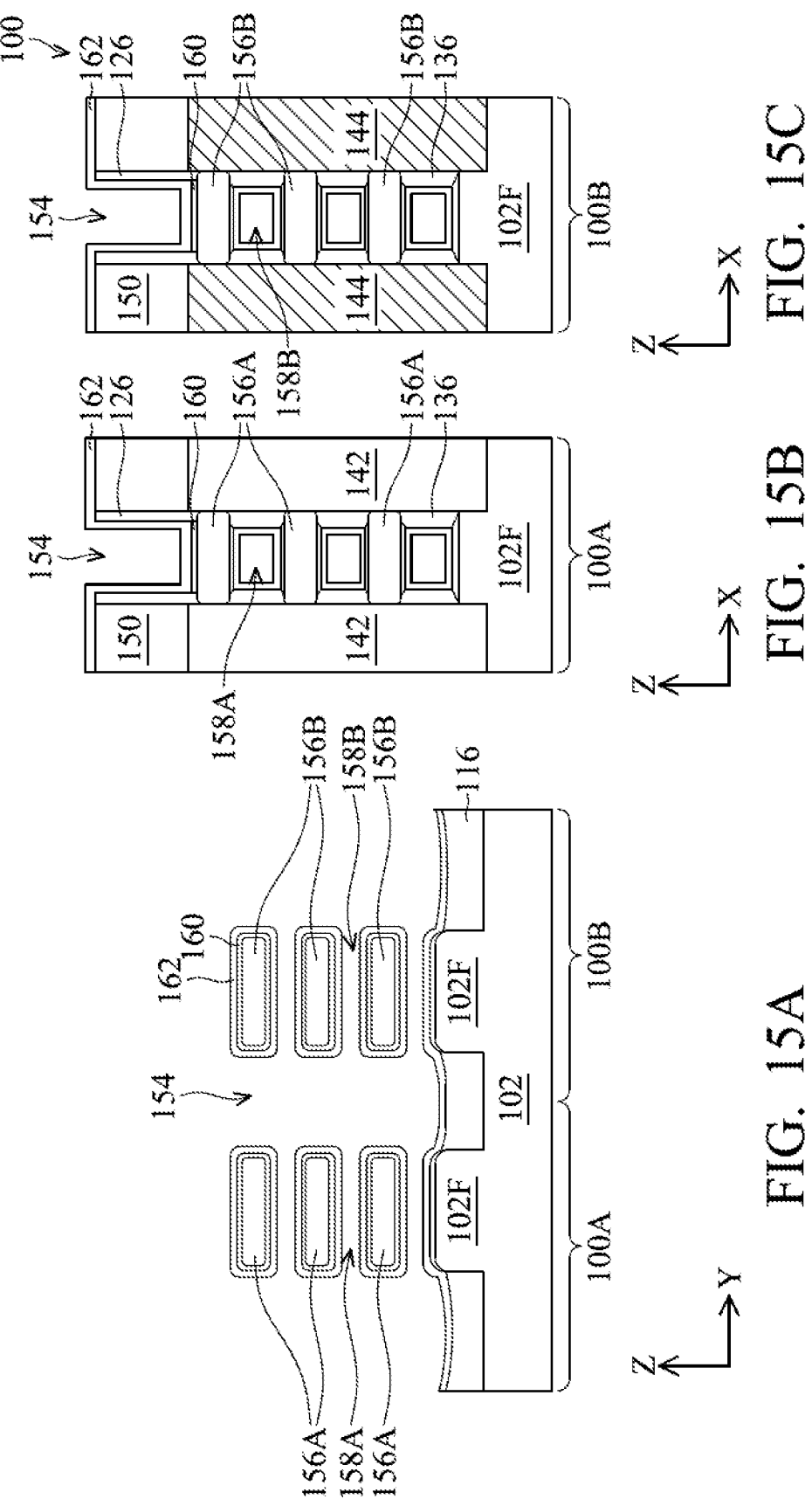

Turning to FIGS. 15A-15C, a gate dielectric layer 162 is conformally deposited over the interfacial layer 160, in accordance with some embodiments. The gate dielectric layer 162 wraps around the channel nanostructures 156A and 156B and is on sidewalls of the gate trench 154.

In some embodiments, the gate dielectric layer 162 may include a high-k dielectric material having a dielectric constant greater than silicon dioxide. Examples of high-k dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO_2$), aluminum oxide ($Al_2O_3$), titanium oxide ($TiO_2$), and hafnium oxide-alumina ($HfO_2$—$Al_2O_3$) alloy. The gate dielectric layer 162 may be formed by CVD, ALD or other suitable methods. In some embodiments, the gate dielectric layer 162 is formed using a conformal deposition process such as ALD in order to ensure that the gate dielectric layer 162 has a uniform thickness around each of channel nanostructures 156A and 156B. The gate dielectric layer 162 may be formed to have a thickness ranging from about 1 nm to about 2.5 nm. In some embodiments, the gate dielectric layer 162 may be formed to have a thickness of about 1.5 nm.

Figures 16A, 16B, 16C:
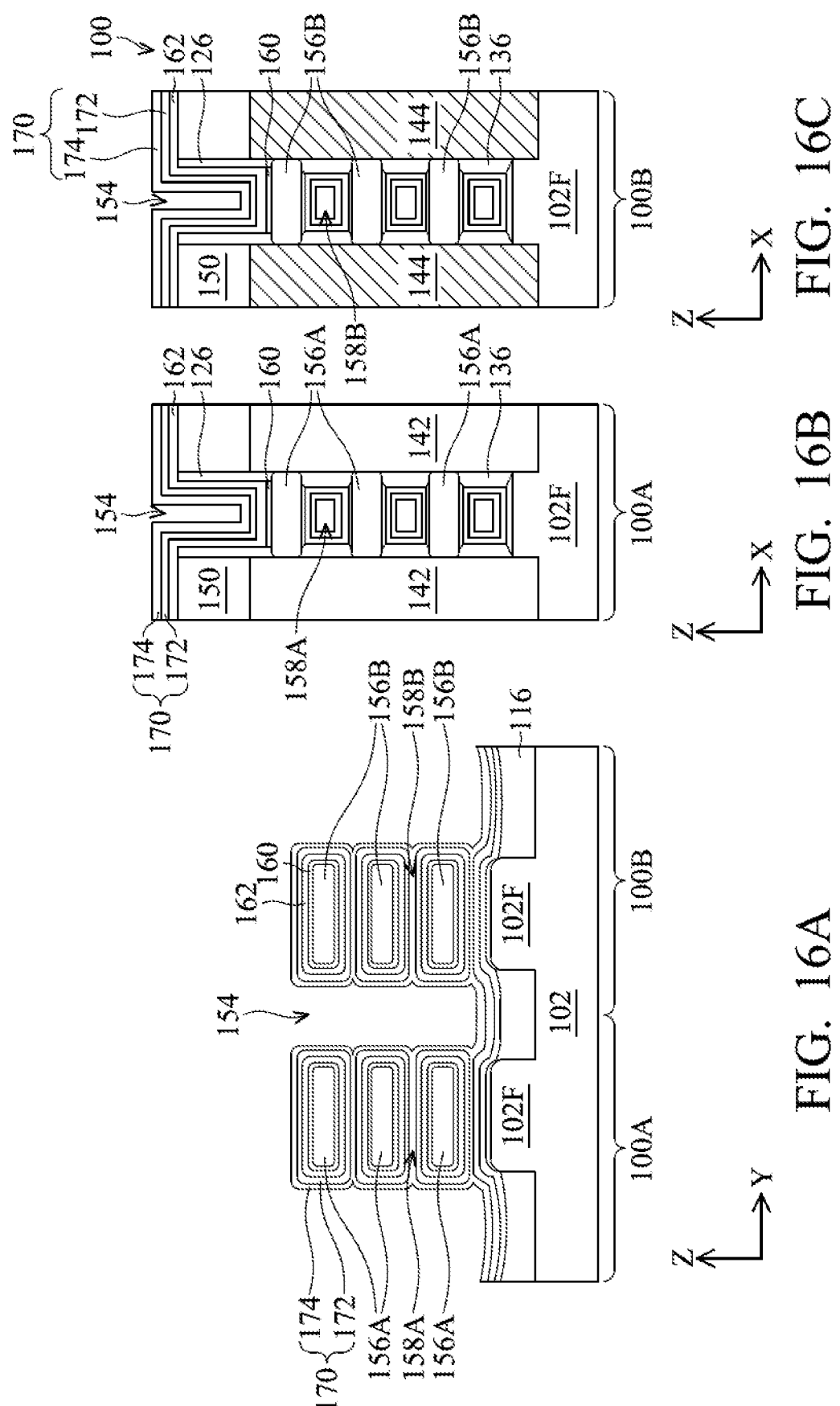

Turning to FIGS. 16A-16C, an n-type metal gate layer 170 is conformally deposited over the gate dielectric layer 162, in accordance with some embodiments.

The channel nanostructures 156A in the NFET region 100A and the channel nanostructures 156B in the PFET region 100B are wrapped around by the interfacial layer 160, the gate dielectric layer 162, and the n-type metal gate layer 170, in sequence. The n-type metal gate layer 170 may include a single layer or alternatively a multi-layer structure. In some embodiments, the n-type metal gate layer 170 has a single-layer structure formed of an n-type work function metal layer 172. The n-type work function metal layer 172 is adapted to tune the threshold voltage Vt1 for n-type FETs formed in the NFET region 100A. Suitable n-type work function materials include, but are not limited to, aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), hafnium carbide (HfC), and combinations thereof. The n-type work function metal layer 172 may be deposited by CVD or ALD. The n-type work function metal layer 172 does not pinch off the spaces 158A and 158B between adjacent channel nanostructures 156A and 156B. In some embodiments, the n-type work function metal layer 172 may be formed to have a thickness ranging from about 1.5 nm to about 2.5 nm.

Alternatively, in some embodiments, the n-type metal gate layer 170 may have a bi-layer structure including an n-type work function metal layer 172 and a cap layer 174 disposed on the n-type work function metal layer 172. The cap layer 174 covers the n-type work function metal layer 172 and some portions of the cap layer 174 are merged in the spaces 158A and 158B between adjacent channel nanostructures 156A and 156B, respectively. The cap layer 174 includes a material that has a different etching selectivity than that of the n-type work function metal layer 172. In some embodiments, the cap layer 174 may include a semiconductor material such as silicon (Si) or a metal nitride such as titanium nitride (TiN) or titanium silicon nitride (TiSiN), or combinations thereof. The cap layer 174 may be deposited by CVD or ALD. In some embodiments, the cap layer 174 may be formed to have a thickness ranging from about 0.5 nm to 1.5 nm. The bi-layered metal gate structure allows for using a thinner n-type work function metal layer 172 compared to the single layer metal gate structure and is helpful for a better wet penetration.

After depositing the n-type metal gate layer 170, the remaining volume of the gate trench 154 may have a width greater than about 2 nm.

Figures 17A, 17B, 17C:
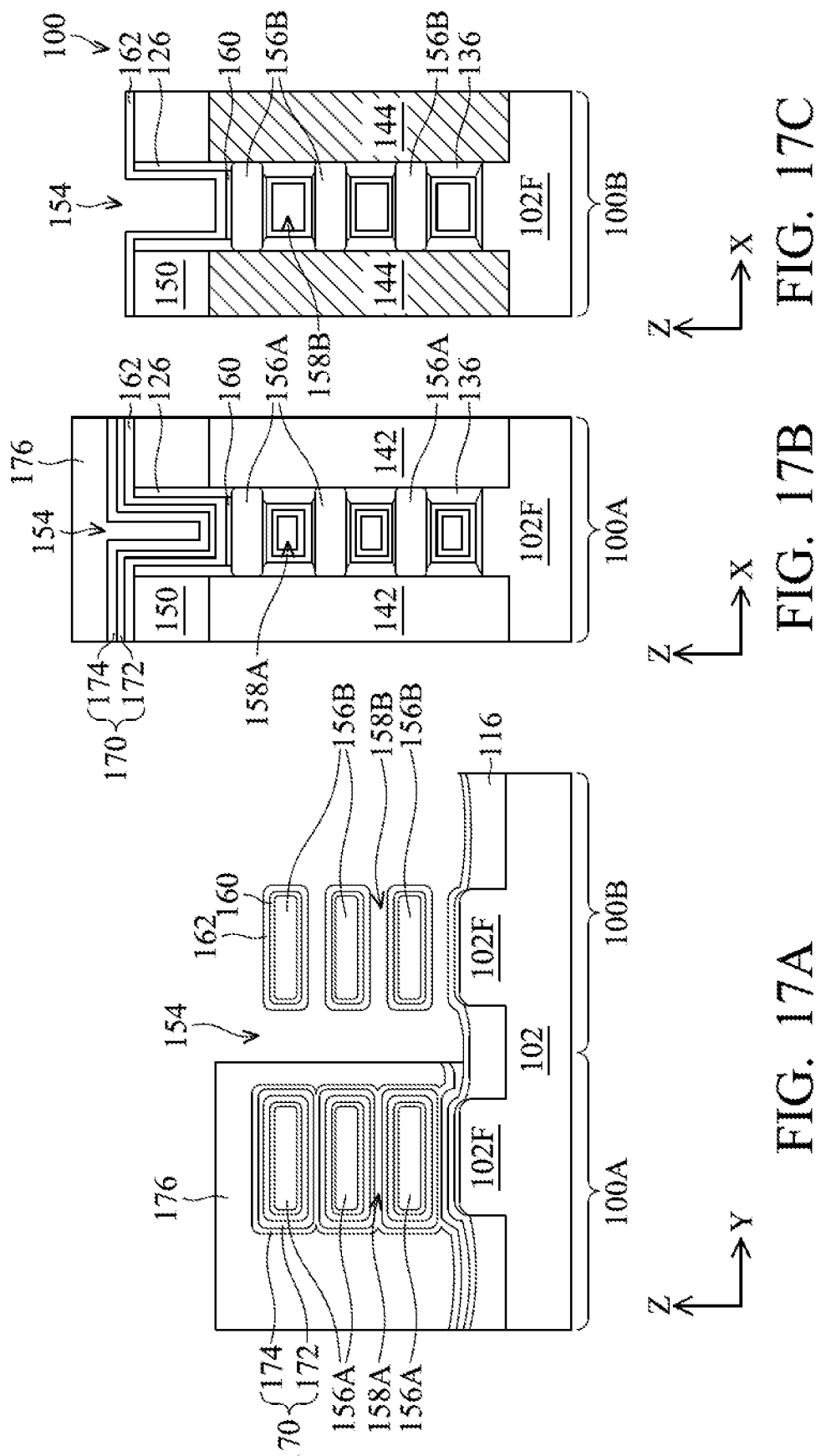

Turning to FIGS. 17A-17C, a patterned mask layer 176 is formed on the n-type metal gate layer 170 to cover a portion of the n-type metal gate layer 170 in the NFET region 100A, while exposing another portion of the n-type metal gate layer 170 in the PFET region 100B, in accordance with some embodiments. The patterned mask layer 176 fills the gate trench 154 in the NFET region 100A. In some embodiments, the patterned mask layer 176 is a patterned photoresist layer and is formed by applying a photoresist layer over the semiconductor device 100, exposing the photoresist layer to a radiation passing through or reflected from a photomask, and developing the exposed photoresist layer in a developing process. In some embodiments, the patterned mask layer 176 includes a combination of a patterned photoresist layer and a patterned hard mask layer. In this case, a hard mask layer is first blanketly deposited over the semiconductor device 100 and then a photoresist layer is applied over the hard mask layer. The photoresist layer is patterned by photolithography to form a patterned photoresist layer. The patterned photoresist layer is used as an etch mask to pattern the hard mask layer so as to form the patterned mask layer 176. In some embodiments, the hard mask layer may include silicon oxide or silicon nitride.

Subsequently, the n-type metal gate layer 170 is removed from the exposed PFET region 100B, while the n-type metal gate layer 170 in the NFET region 100A remains masked by the patterned mask layer 176. In some embodiments, a wet etching process is performed to remove the portion of the n-type metal gate layer 170 in the PFET region 100B that is exposed by the patterned mask layer 176. In some embodiments, the wet etching process is performed with an etchant solution, for example, an acid solution of HCl, $NH_4OH$ or $H_2SO_4$ mixed with an oxidant of $H_2O_2$. The etching amount of the wet etching process can be adjusted by changing the etching time and temperature. In instances when the n-type metal gate layer 170 has a bi-layer structure, the cap layer 174 and the n-type work function metal layer 172 may be etched using different etchants in two different etching processes due to the differing etching selectivities of the n-type work function metal layer 172 and the cap layer 174. For example, a first wet etching process is performed to remove a portion of the cap layer 174 from the PFET region 100B without (or minimally) etching the n-type work function metal layer 172, followed by a second etching process that removes a portion of the n-type work function metal layer 172 from the PFET region 100B without (or minimally) etching the remaining portion of the cap layer 174 in the PFET region 100B. The different etching chemistries help to minimize the lateral etching of both n-type work function metal layer 172 and the cap layer 174 along N/P boundary between the NFET and PFET regions 100A and 100B. As a result, the gate metal loss at the N/P boundary is avoided. As shown in FIG. 17A, after etching, the n-type work function metal layer 172 may have a sidewall that is aligned with a sidewall of the cap layer 174 at the boundary between the NFET and PFET regions 100A and 100B.

After removing the n-type metal gate layer 170 from the PFET region 100B, the spaces 158B re-appear between adjacent channel nanostructures 156B. The patterned mask layer 176 is then removed using a suitable etching process. In some embodiments, the patterned mask layer 176 may be removed by an ashing process using $N_2$ and $H_2$.

Figures 18A, 18B, 18C:
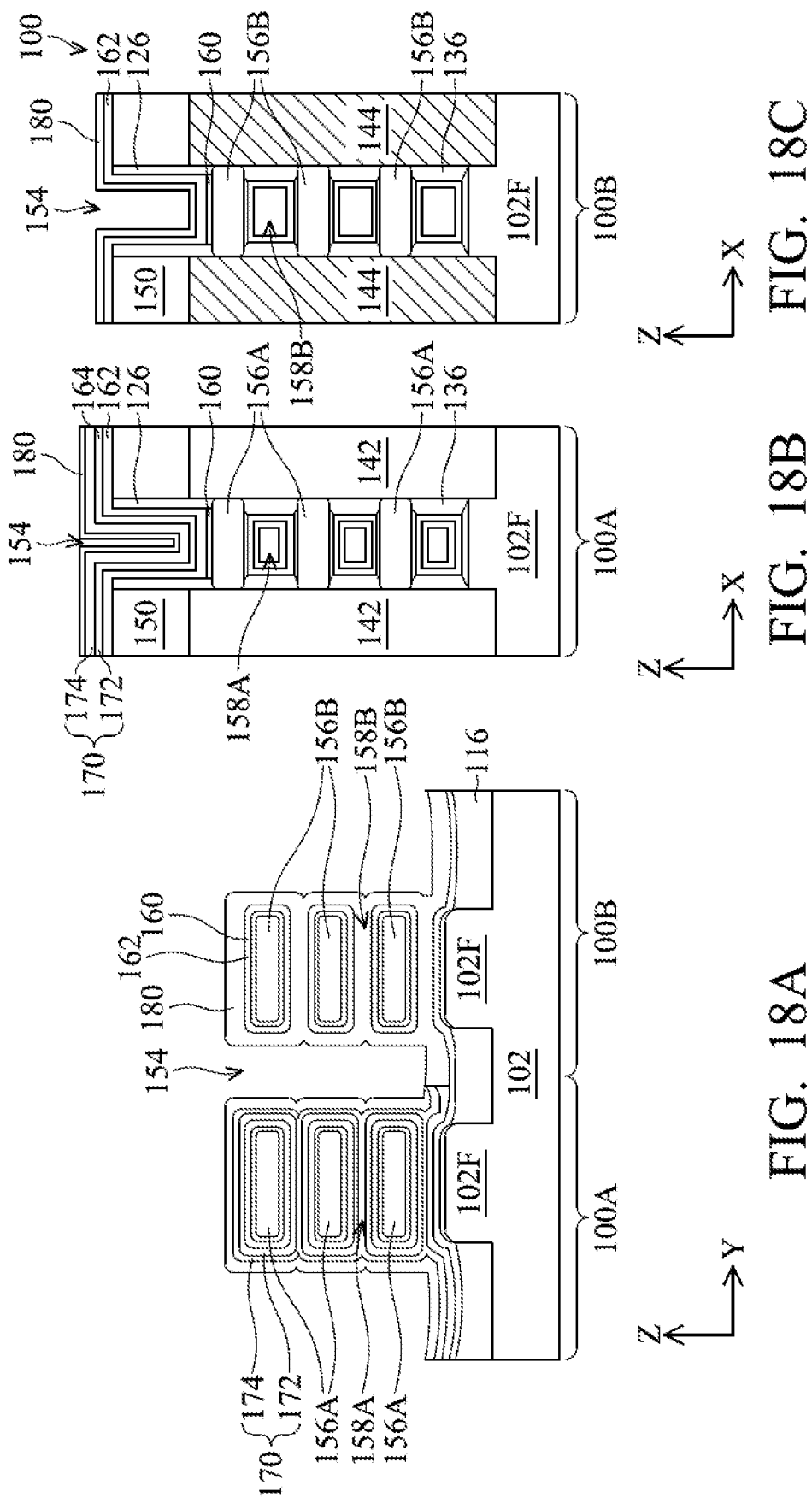

Turning to FIGS. 18A-18C, a p-type work function metal layer 180 is conformally deposited on a topmost surface of the n-type metal gate layer 170 (e.g., a top surface of the cap layer 174 if present or a top surface of the n-type work function metal layer 172) in the NFET region 100A and on the gate dielectric layer 162 in the PFET region 100B, in accordance with some embodiments.

In the NFET region 100A, the p-type work function metal layer 180 is deposited over the n-type metal gate layer 170 and does not wrap around each of the channel nanostructures 156A. In the PFET region 100B, the p-type work function metal layer 180 is deposited over the gate dielectric layer 162 and wraps around each of the channel nanostructures 156B. The p-type work function metal layer 180 merges in the spaces 158B between adjacent channel nanostructures 156B.

The p-type work function metal layer 180 is adapted to tune the threshold voltage Vt2 for p-type FETs formed in the PFET region 100B. In some embodiments, the p-type work function metal layer 180 includes tungsten (W), molybdenum (Mo), tungsten nitride (WN), tungsten carbon nitride (WCN), tantalum silicon nitride (TaSiN), or tantalum nitride (TaN). The p-type work function metal layer 180 may be formed by a conformal deposition process such as, for example, ALD or CVD. In some embodiments, the p-type work function metal layer 180 may be formed to have a thickness at least about 0.5 nm to about 1 nm thicker than the n-type work function metal layer 172. In some embodiments, the p-type work function metal layer 180 has a thickness ranging from about 3 nm to about 5 nm.

Figures 19A, 19B, 19C:
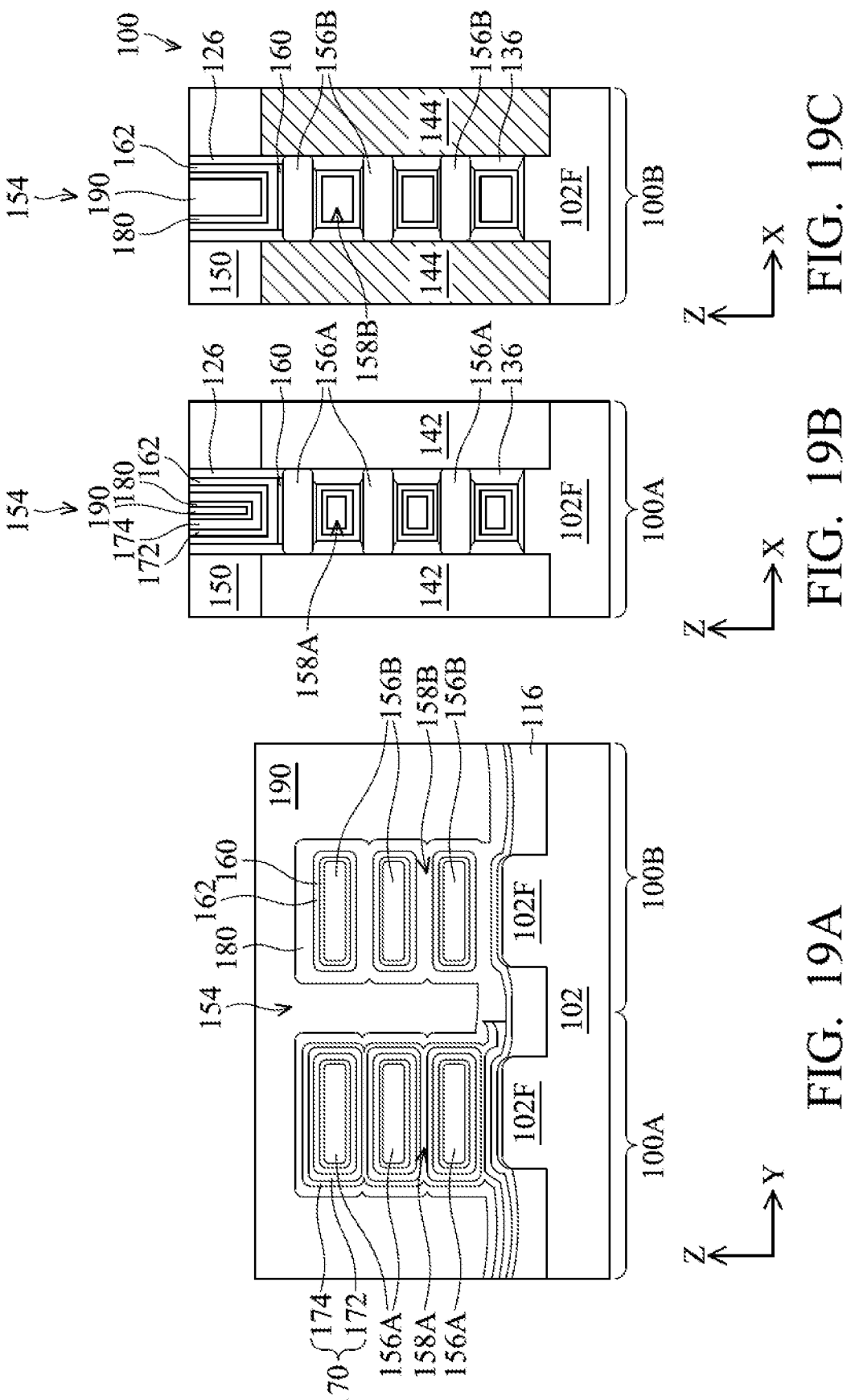

Turning to FIGS. 19A-19C, a metal gate fill material layer 190 is deposited to fill a remaining space of the gate trench 154. In some embodiments, the metal gate fill material layer 190 may include tungsten (W) or cobalt (Co) and may be deposited by CVD, PVD or ALD. Subsequently, excess portions of the metal gate fill material layer 190, the p-type work function metal layer 180, the cap layer 174, the n-type work function metal layer 172, and the gate dielectric layer 162 on a top surface of the ILD layer 150 may be removed by a planarization process such as a CMP process, in accordance with some embodiments. The top surfaces of the ILD layer 150, the gate dielectric layer 162, the n-type work function metal layer 172, the cap layer 174, the p-type work function metal layer 180, and the metal gate fill material layer 190 are thus coplanar with each other in the gate trench 154. Because the n-type metal gate patterning-first process removes portions of the n-type work function metal layer 172 and the cap layer 174 from the PFET region 100B, while portions of the n-type work function metal layer 172 and the cap layer 174 in the NFET region 100A remains, less amount of metal is needed to completely fill the remaining space of the portion of gate trench 154 in the NFET region 100A compared to the amount of metal that is needed to completely fill the remaining space of the portion of gate trench 154 in the PFET region 100B. As a result, the metal gate fill material layer 190 in the NFET region 100A has a width smaller than the width of the metal gate fill material layer 190 in the PFET region 100B.

Thus, an n-type GAA device is formed in the NFET region 100A and a p-type GAA device is formed in the PFET region 100B.

Figure 20:
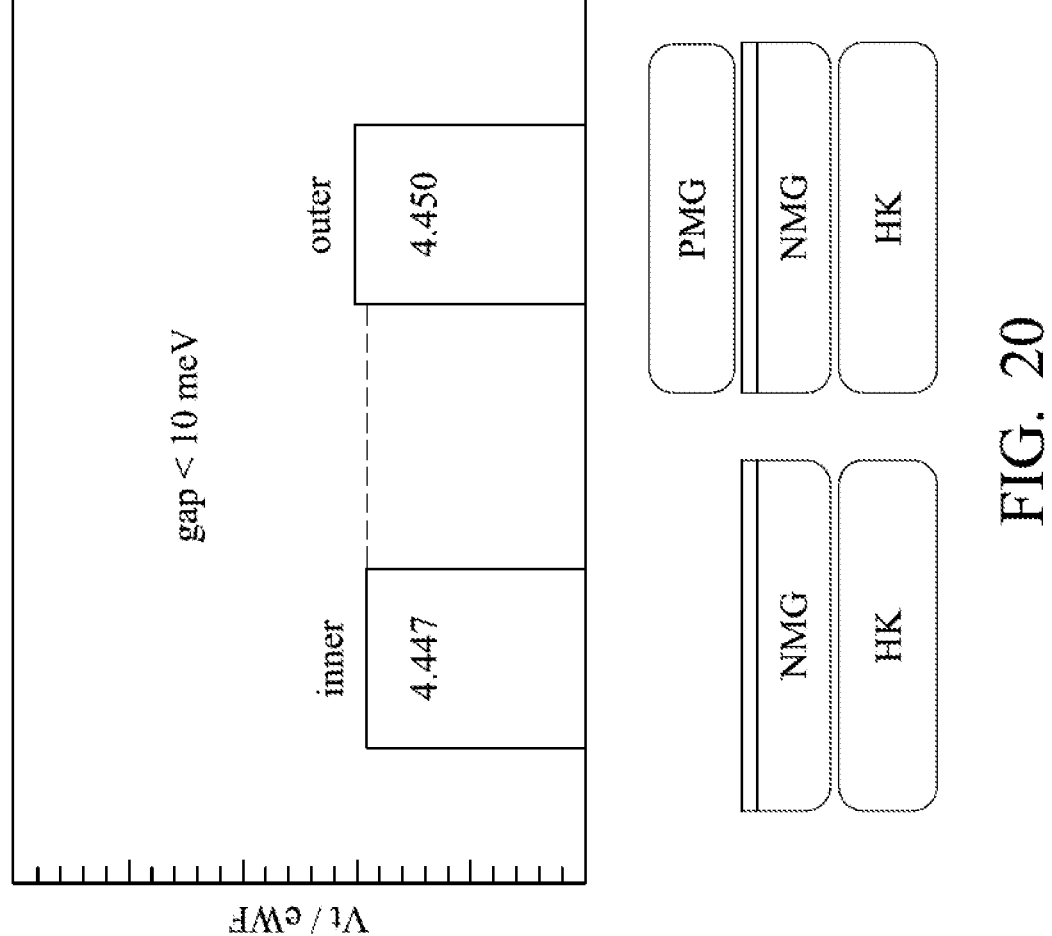
FIG. 20 is a graph showing variation of effective work functions of n-type metal gate stacks in relation to the presence of a p-type work function metal layer over an n-type work function metal layer.

The n-type GAA device in the NFET region 100A is featured with an n-type metal gate stack wrapping around the channel nanostructures 156A. As shown in FIGS. 19A and 19B, the gate trench 154 between the gate spacers 126 above the topmost channel nanostructure 156A is filled with the interfacial layer 160, the gate dielectric layer 162, the n-type work function metal layer 172, the cap layer 174, the p-type work function metal layer 180, and the metal gate fill material layer 190. The spaces 158A between adjacent channel nanostructures 156A and between the lowest channel nanostructure 156A and the fin base 102F are filled with the interfacial layer 160, the gate dielectric layer 162, the n-type work function metal layer 172, and the cap layer 174. In the NFET region 100A, the n-type GAA device has a first threshold voltage that is mainly influenced by the n-type work function metal layer 172. The effect to the effective work function (eWF) of the n-type metal gate stack due to the presence of the p-type work function metal layer 180 is minimal. For example, as shown in FIG. 20, after forming a p-type work function metal layer 180 over an n-type work function metal layer 172, the effective work function of the n-type metal gate stack is increased by less than 10 meV.

The p-type GAA device in the PFET region 100B is featured with a p-type metal gate stack wrapping around the channel nanostructures 156B. As shown in FIGS. 19A and 19C, the gate trench 154 between the gate spacers 126 above the topmost channel nanostructure 156B is filled with the interfacial layer 160, the gate dielectric layer 162, the p-type work function metal layer 180, and the metal gate fill material layer 190. The spaces 158B between adjacent channel nanostructures 156B and between the lowest channel nanostructure 156B and the fin base 102F are filled with the interfacial layer 160, the gate dielectric layer 162, and the p-type work function metal layer 180. Because the n-type work function metal layer 172 is only present in the NFET region 100A, but not in the PFET region 100B, the p-type GAA device has a first threshold voltage that is mainly influenced by the p-type work function metal layer 180.

By using an n-type metal gate patterning-first process to form multiple patterning gates for NFETs and PFETs which allows using a thin n-type work function metal layer, longer exposure to etchant(s) necessary to remove a thicker p-type work function metal layer in the conventional p-type metal gate patterning-first process is no longer needed. The embodiments of the present disclosure can avoid lateral removal of the n-type work function metal layer 172 in the NFET region 100A during the etching processes, and thereby preventing damage to the n-type work function metal layer 172. As a result, the Vt level and Vt uniformity of NFETs are improved. Accordingly, the embodiments of the present disclosure can enlarge metal gate patterning and cut metal gate window, which makes rule scaling in both Y-direction (i.e., cell height scaling) and X-direction (i.e., gate pitch scaling) variable.

FIGS. 21A-29C are cross-sectional views of intermediate stages in the formation of the semiconductor device 100, in accordance with alternative embodiments. Unless specified otherwise, the materials and the formation methods of the components in these embodiments are essentially the same as their like components, which are denoted by like reference numerals in the embodiments shown in FIGS. 2A-19C. The details regarding the formation processes and the materials of the components shown in FIGS. 21A-29C are thus found in the discussion of the embodiments shown in FIGS. 2A-19C.

FIGS. 21A-29C are fragmentary views of intermediate stages in the formation of a semiconductor device 100, in accordance with alternative embodiments. In particular, FIGS. 21A, 22A, 23A, 24A, 25A, 26A, 27A, 28A and 29A are cross-sectional views of the semiconductor device 100 in an Y-Z plane along line A-A of FIG. 1, FIGS. 21B, 22B, 23B, 24B, 25B, 26B, 27B, 28B and 29B are cross-sectional views of the semiconductor device 100 in a X-Z plane along line B-B of FIG. 1, and FIGS. 21C, 22C, 23C, 24C, 25C, 26C, 27C, 28C and 29C are cross-sectional views of the semiconductor device 100 in a X-Z plane along line C-C of FIG. 1.

The initial steps for fabricating the semiconductor device 100 that involve forming channel nanostructures 156A and 156B from a stack 104 of semiconductor layers 106 and 108 on a substrate 102 are similar to those described in FIGS. 2A-13C.

Figures 21A, 21B, 21C:
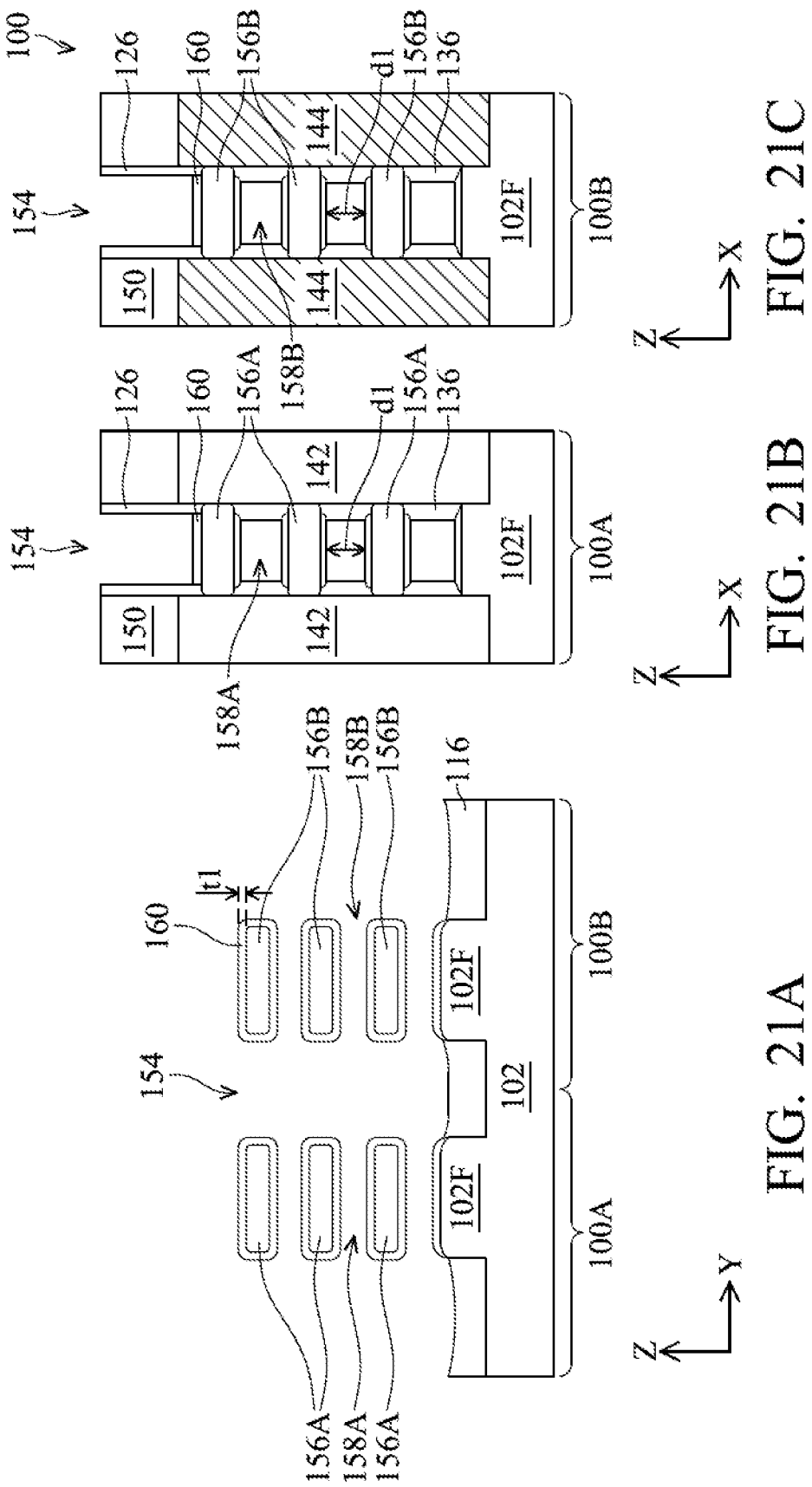

Afterwards, an interfacial layer 160 is formed around the channel nanostructures 156A and 156B. FIGS. 21A-21C illustrate cross-sectional views of the semiconductor device 100 following formation of the interfacial layer 160, which may be formed by processes that are described above with reference to FIGS. 14A-14C.

Referring to FIGS. 21A-21C, the interfacial layer 160 is formed to have a thickness greater than that of an interfacial layer formed in conventional GAA metal gate structures. Accordingly, the distance d1 between portions of the interfacial layer 160 disposed in the spaces 158A between adjacent channel nanostructures 156A and in the spaces 158B between adjacent channel nanostructures 156B is reduced compared to that in conventional GAA metal gate structures after formation of the interfacial layer 160. In some embodiments, the interfacial layer 160 has a thickness t1 that is at least about 0.25 nm thicker than a thickness (typically in the range of from about 0.5 nm to about 1 nm) of an interfacial layer in conventional GAA metal gate structures. In some embodiments, the thickness t1 of the interfacial layer 160 is about 0.25 nm to 0.5 nm thicker than a thickness of an interfacial layer in conventional GAA metal gate structures. In some embodiments, the interfacial layer 160 is formed to have a thickness t1 ranging from about 1.25 nm to about 1.5 nm. In some embodiments, the interfacial layer 160 may be formed to have a thickness t1 of about 1.25 nm.

Figures 22A, 22B, 22C:
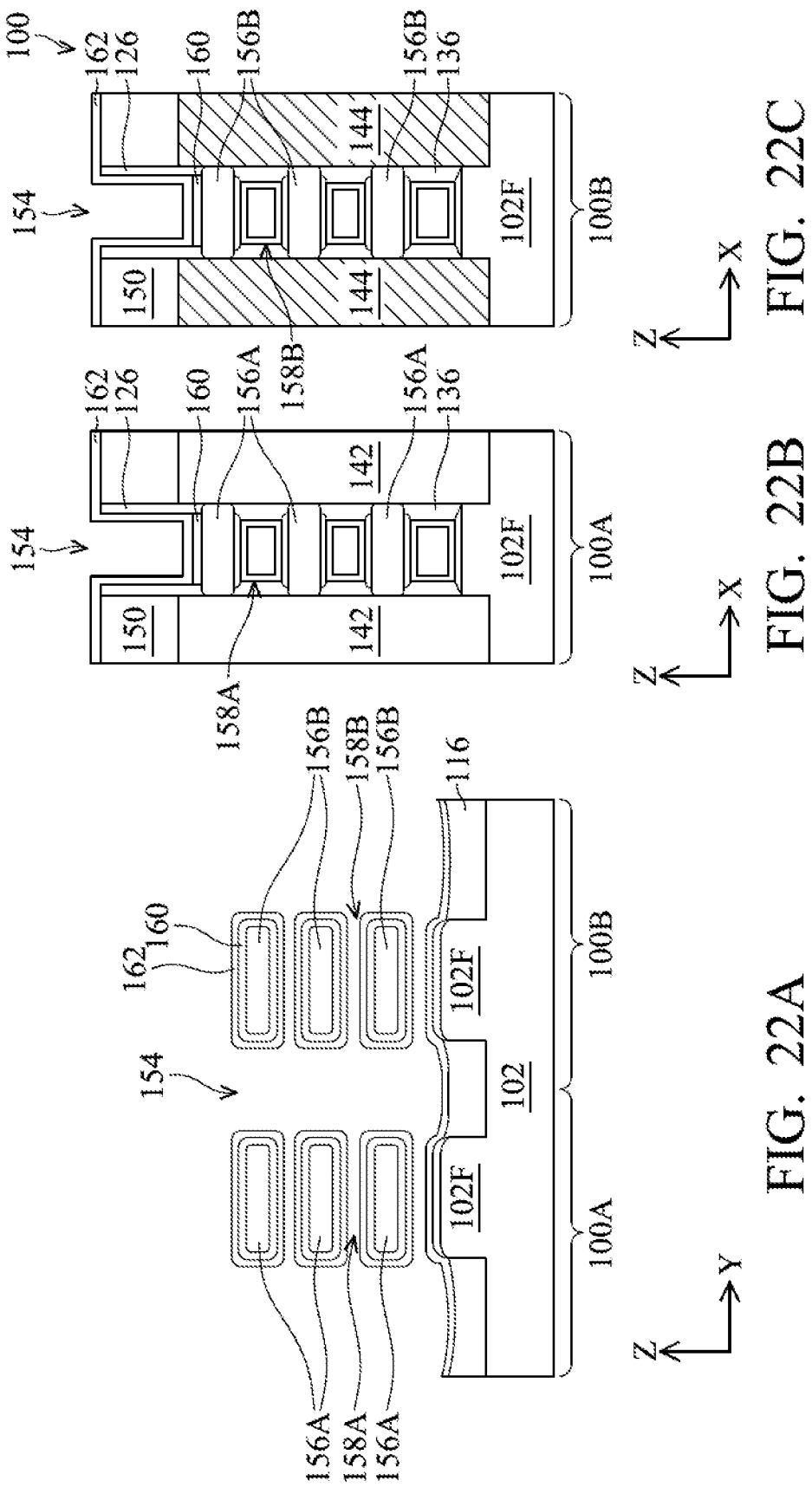

Turning to FIGS. 22A-22C, a gate dielectric layer 162 is conformally deposited on the interfacial layer 160, in accordance with some embodiments. In some embodiments, the gate dielectric layer 162 includes a high-k dielectric material and is formed by fabrication processes described above in FIGS. 14A-14B.

Figures 23A, 23B, 23C:
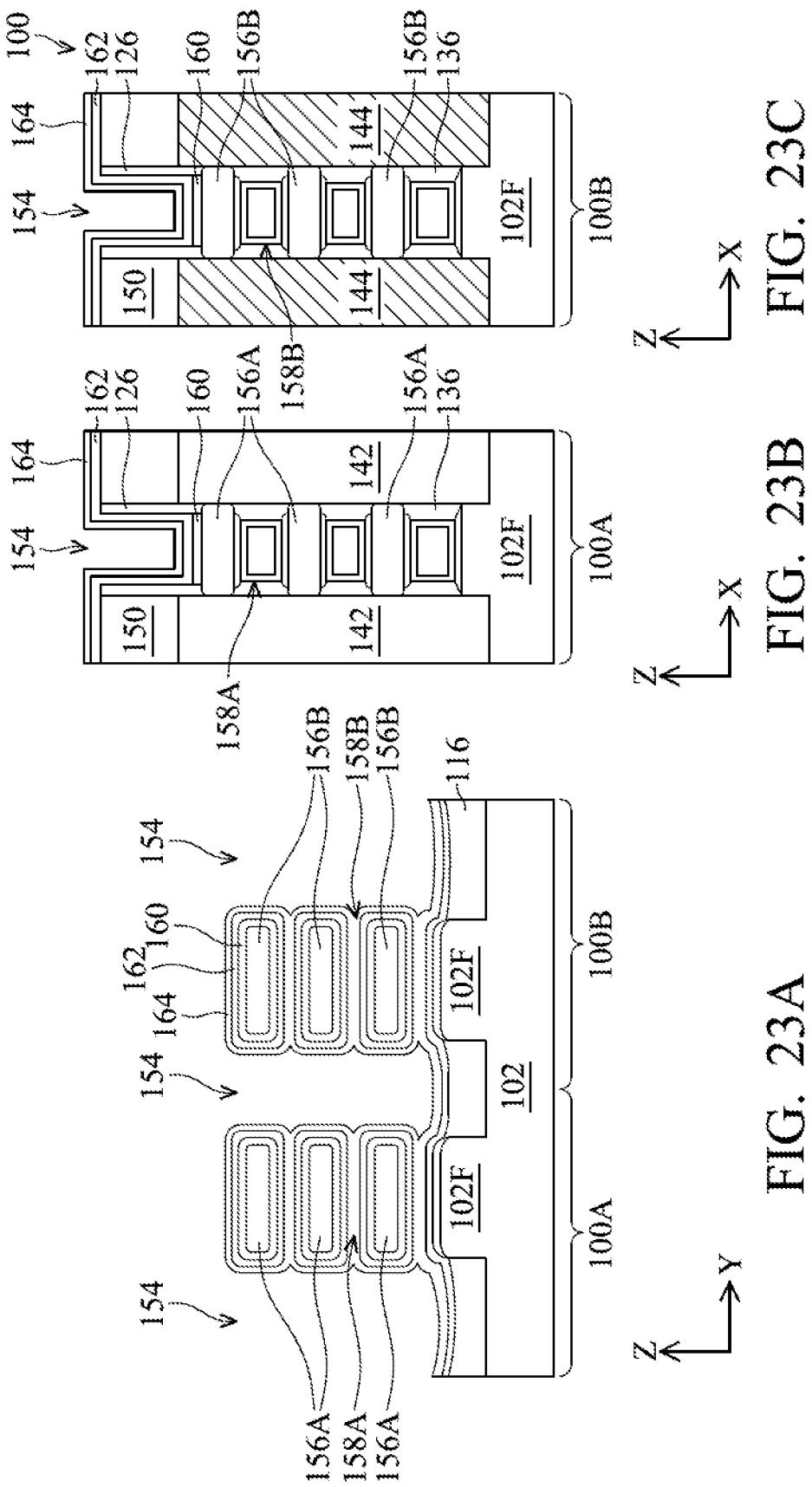

Turning to FIGS. 23A-23C, a sacrificial layer 164 is conformally deposited on the gate dielectric layer 162, in accordance with some embodiments. The sacrificial layer 164 fills the remaining volumes of spaces 158A and 158B between adjacent channel nanostructures 156A and 156B, respectively. Portions of the sacrificial layer 164 that are disposed between adjacent channel nanostructures 156A and 156B are merged. The thick interfacial layer 160 allows formation of a thin sacrificial layer 164 for merging of channel nanostructures 156A and 156B. The thin sacrificial layer 164 also occupies less volume of the gate trench 154, which helps to enlarge the gate metal deposition window as the gate length scales.

The sacrificial layer 164 is formed of a material that may be selectively removed without (or minimally) etching the gate dielectric layer 162. In some embodiments, the sacrificial layer 164 may include an oxide such as silicon oxide, aluminum oxide, or zirconium oxide, or a nitride such as silicon nitride or titanium nitride. In some embodiments, the sacrificial layer 164 includes silicon oxide or silicon nitride. The sacrificial layer 164 may be deposited using a conformal deposition process such as, for example, CVD or ALD. The sacrificial layer 164 may have a thickness ranging from about 2 nm to about 3.5 nm.

Figures 24A, 24B, 24C:
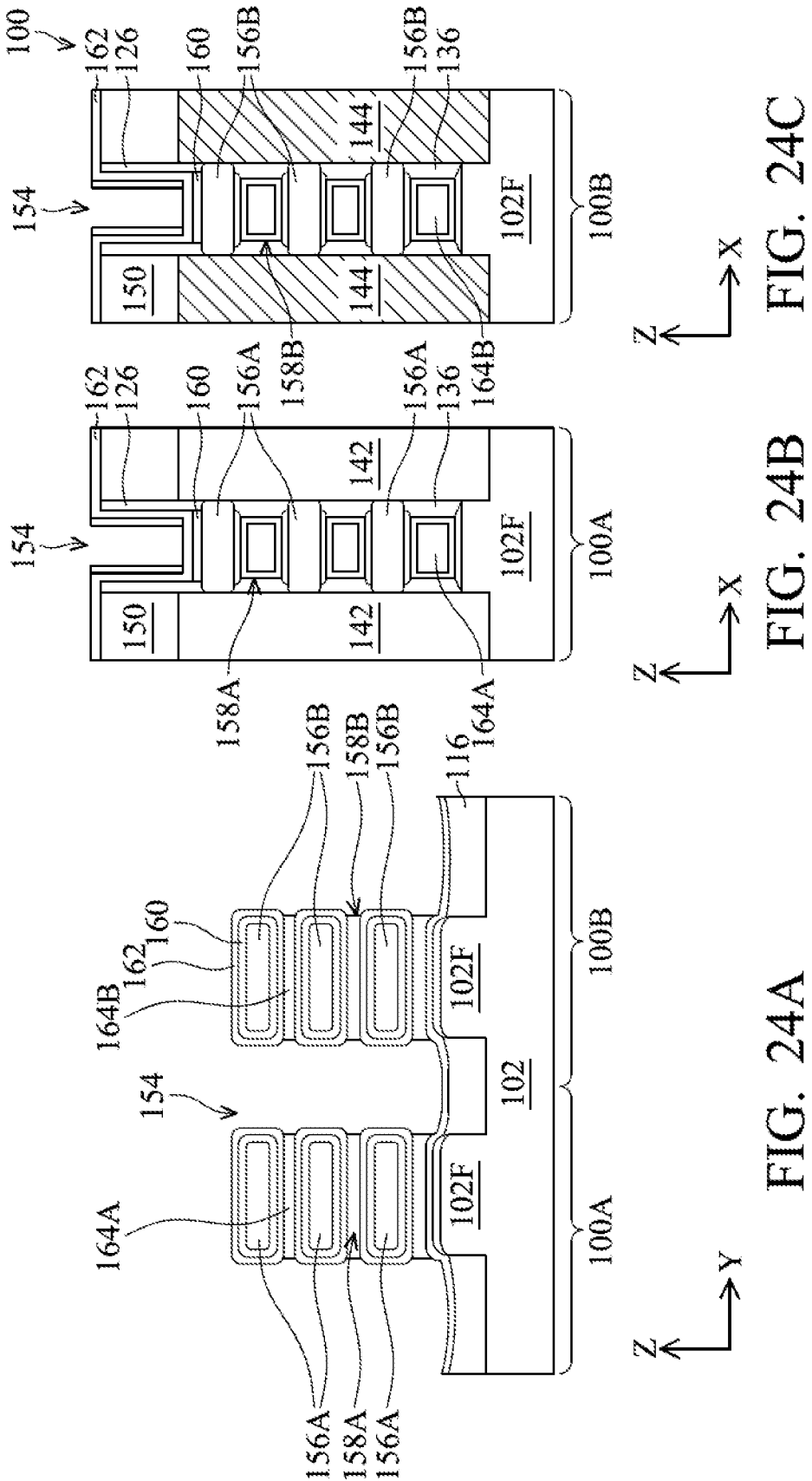

Turning to FIGS. 24A-24C, a portion of the sacrificial layer 164 is removed, in accordance with some embodiments. In some embodiments, the sacrificial layer 164 is removed from the topmost surfaces and side surfaces of the channel nanostructures 156A and 156B, to expose the gate dielectric layer 162 deposited thereon. Here, the topmost surface refer to the top surface of the topmost nanostructure channel in each set of channel nanostructures 156A and channel nanostructures 156B. In some embodiments, the removal of the sacrificial layer 164 includes a dry etching process or a wet etching process that etches the sacrificial layer 164 selective to the gate dielectric layer 162. Portions of sacrificial layer 164 disposed between adjacent channel nanostructures 156A and 156B and on sidewalls of the gate spacers 126 remain after conclusion of the etching process. The remaining portion of the sacrificial layer 164 in the NFET region 100A is herein referred to as a first sacrificial layer portion 164A, and the remaining portion of the sacrificial layer 164 in the PFET region 100B is herein referred to as a second sacrificial layer portion 164B.

Figures 25A, 25B, 25C:
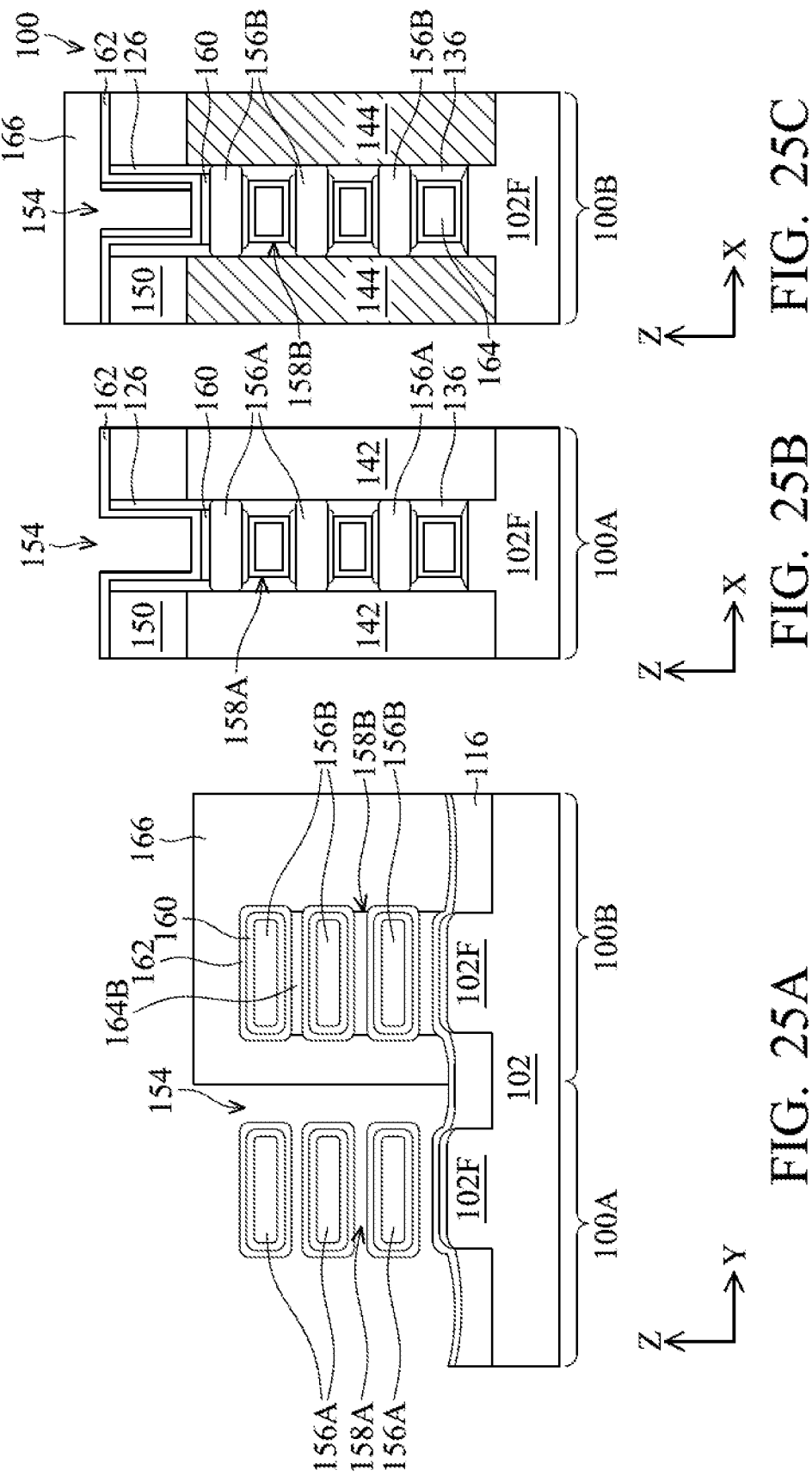

Turning to FIGS. 25A-25C, the first sacrificial layer portion 164A in the NFET region 100A is selectively removed, in accordance with some embodiments.

In some embodiments represented in FIGS. 25A and 25C, a patterned mask layer 166 may be formed such that the PFET region 100B is covered by the patterned mask layer 166 and the NFET region 100A is exposed. In some embodiments, the patterned mask layer 166 is a patterned photoresist layer and is formed by applying a photoresist layer over the semiconductor device 100, exposing the photoresist layer to a radiation passing through or reflected from a mask, post-baked, and developing the exposed photoresist layer in a developing process. In some embodiments, the patterned mask layer 166 includes a combination of a patterned photoresist layer and a patterned hard mask layer. In this case, a hard mask layer is first blanketly deposited over the semiconductor device 100 and then a photoresist layer is applied over the hard mask layer. The photoresist layer is patterned by photolithography to form a patterned photoresist layer. The patterned photoresist layer is used as an etch mask to pattern the hard mask layer so as to form the patterned mask layer 166. In some embodiments, the hard mask layer may include silicon oxide or silicon nitride.

Subsequently, the first sacrificial layer portion 164A is removed from the exposed NFET region 100A by an etching process while the second sacrificial layer portion 164B in the PFET region 100B remains masked by the patterned mask layer 166. In some embodiments, a wet etching process is performed to selectively etch the first sacrificial layer portion 164A without (or minimally) affecting the gate dielectric layer 162 and the patterned mask layer 166. After removing the first sacrificial layer portion 164A from the NFET region 100A, the spaces 158A between the adjacent channel nanostructures 156A re-appear.

After removal of the first sacrificial layer portion 164A, the patterned mask layer 166 is subsequently removed using a suitable etching process. In some embodiments, the patterned mask layer 166 may be removed by an ashing process using $N_2$ and $H_2$.

Figures 26A, 26B, 26C:
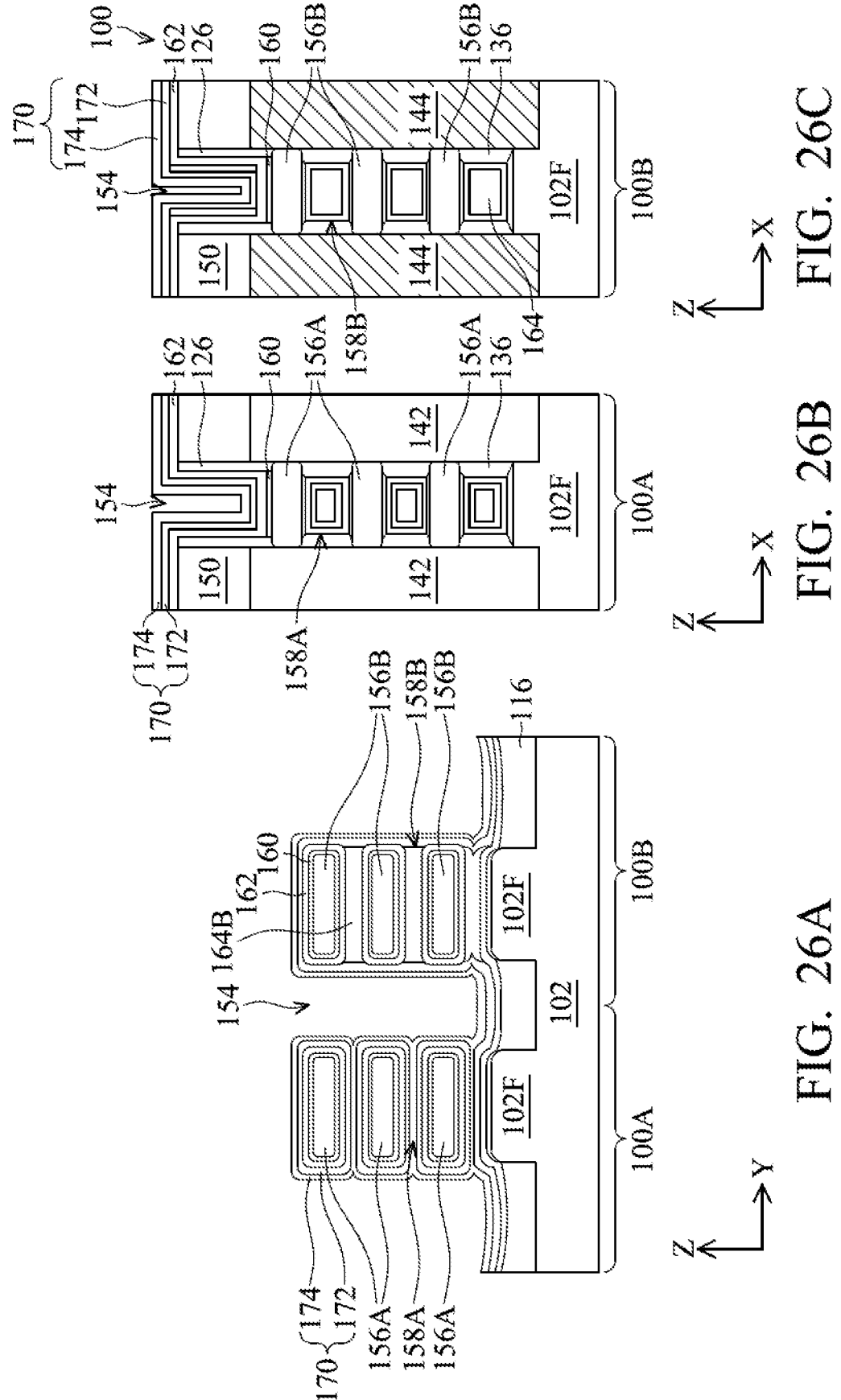

Turning to FIGS. 26A-26C, an n-type metal gate layer 170 is conformally deposited over the channel nanostructures 156A and 156B, in accordance with some embodiments. As described above in FIGS. 16A-16C, in some embodiments, the n-type metal gate layer 170 includes an n-type work function metal layer 172. In some other embodiments, the n-type metal gate layer 170 includes an n-type work function metal layer 172 and a cap layer 174. Because the second sacrificial layer portion 164B remains between adjacent channel nanostructures 156B in the PFET region 100B, the n-type metal gate layer 170 is prevented from being deposited between the channel nanostructures 156B, and is only present on side surfaces and the topmost surface of the channel nanostructures 156B. On the contrary, as the NFET region 100A is substantially free from the first sacrificial layer portion 164A, in the NFET region 100A, the n-type metal gate layer 170 is formed to wrap around each of the channel nanostructures 156A and merges in the spaces 158A between adjacent channel nanostructures 156A.

Figures 27A, 27B, 27C:
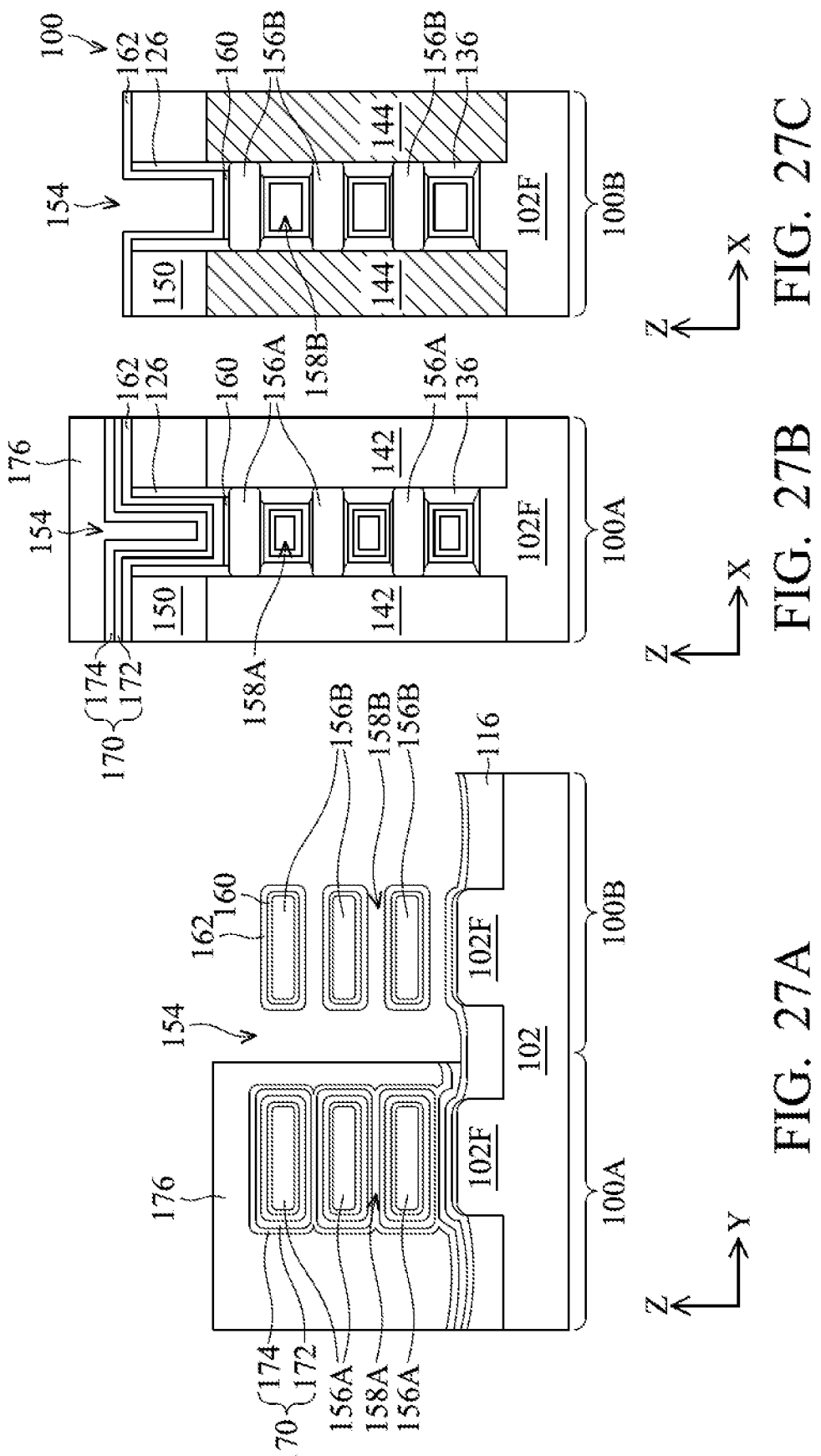

Turning to FIGS. 27A-27C, the n-type metal gate layer 170 and the second sacrificial layer portion 164B are selectively removed from the PFET region 100B, in accordance with some embodiments.

In some embodiments, a patterned mask layer 176 may be formed such that the NFET region 100A is covered by the patterned mask layer 176 and the PFET region 100B is exposed. In some embodiments, the patterned mask layer 176 is a patterned photoresist layer and is formed by applying a photoresist layer over the semiconductor device 100, exposing the photoresist layer to a radiation passing through or reflected from a mask, post-baked, and developing the exposed photoresist layer in a developing process. In some embodiments, the patterned mask layer 176 includes a combination of a patterned photoresist layer and a patterned hard mask layer. In this case, a hard mask layer is first blanketly deposited over the semiconductor device 100 and then a photoresist layer is applied over the hard mask layer. The photoresist layer is patterned by photolithography to form a patterned photoresist layer. The patterned photoresist layer is used as an etch mask to pattern the hard mask layer so as to form the patterned mask layer 176. In some embodiments, the hard mask layer may include silicon oxide or silicon nitride.

Subsequently, the n-type metal gate layer 170 and the second sacrificial layer portion 164B are removed from the exposed PFET region 100B while the n-type metal gate layer 170 in the NFET region 100A remains masked by the patterned mask layer 176. In some embodiments, the n-type work function metal layer 172, the cap layer 174, and the second sacrificial layer portion 164B may be removed using different etchants in three different etching processes, such that each of the etching processes is geared toward the material to be removed. After removing the n-type metal gate layer 170 and the second sacrificial layer portion 164B from the PFET region 100B, the spaces 158B between the adjacent channel nanostructures 156B re-appear.

Next, the patterned mask layer 176 is removed using a suitable etching process. In some embodiments, the patterned mask layer 176 may be removed by an ashing process using $N_2$ and $H_2$.

In embodiments of the present disclosure, as a result of forming a thicker interfacial layer 160 which leads to the reduction in the thickness of the n-type metal gate layer 170, the etching time(s) for removing the n-type metal gate layer 170 from the PFET region 100B is reduced. Then, portions of the n-type metal gate layer 170 that are covered by the patterned mask layer 176 and closest to the channel nanostructures 156A are not exposed to the etching process as long. Because the etching process is quicker and exposure of the n-type metal gate layer 170 to the etchant(s) is reduced, the embodiments of the present disclosure can avoid lateral removal of the n-type work function metal layer 172 in the NFET region 100A during the metal gate patterning, and thereby enhances the NFET and PFET boundary anchor. Therefore, the n-type work function metal layer 172 in the NFET region 100A is not damaged by the metal gate patterning process, which in turn reduces or eliminates the adverse impact of the metal gate damaging on Vt level and Vt uniformity of NFETs. Accordingly, formation of a thick interfacial layer can help to improve patterning capability as scaling of cell heights and gate pitches.

Figures 28A, 28B, 28C:
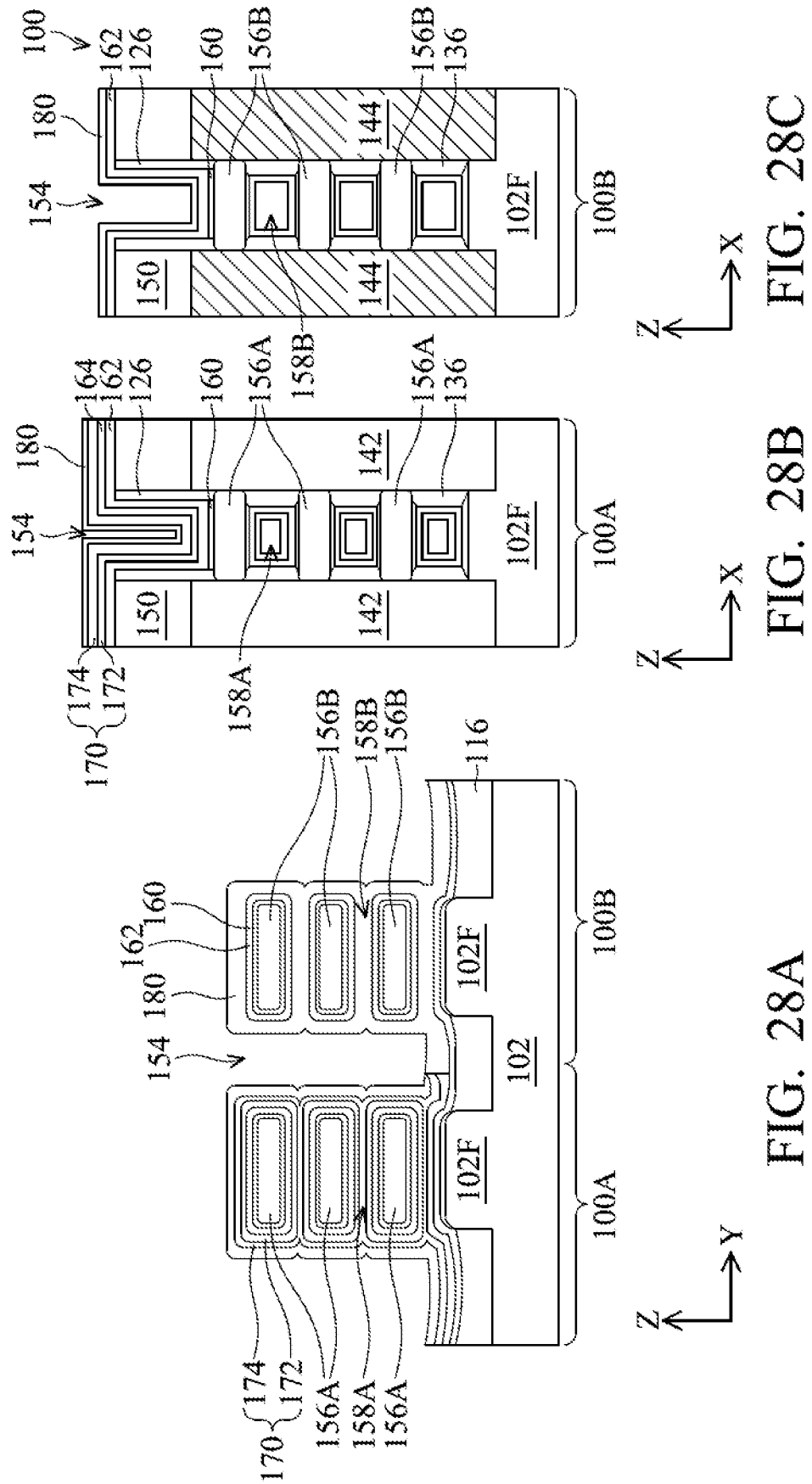

Turning to FIGS. 28A-28C, a p-type work function metal layer 180 is conformally deposited on a topmost surface of the n-type metal gate layer 170 (e.g., the cap layer 174) in the NFET region 100A and on the gate dielectric layer 162 in the PFET region 100B, in accordance with some embodiments.

In the NFET region 100A, the p-type work function metal layer 180 is deposited over the n-type metal gate layer 170 (e.g., the cap layer 174). The p-type work function metal layer 180 thus is present on the side surfaces and the topmost surface of the channel nanostructures 156A, and does not wrap around each of the channel nanostructures 156A. In the PFET region 100B, the p-type work function metal layer 180 is deposited over the gate dielectric layer 162 and wraps around each of the channel nanostructures 156B. In some embodiments, the p-type work function metal layer 180 pinches off the spaces 158B between adjacent channel nanostructures 156B.

The p-type work function metal layer 180 is adapted to tune the threshold voltage Vt2 for p-type FETs formed in the PFET region 100B. In some embodiments, the p-type work function metal layer 180 includes tungsten (W), molybdenum (Mo), tungsten nitride (WN), tungsten carbon nitride (WCN), tantalum silicon nitride (TaSiN), or tantalum nitride (TaN). The p-type work function metal layer 180 may be formed by a conformal deposition method such as, for example, ALD or CVD. As a thick p-type work function metal layer 180 is needed to properly function as gate metal for PFETs, in some embodiments, the p-type work function metal layer 180 is formed to be at least 0.5-1 nm thicker than the n-type work function metal layer 172. In some embodiments, the p-type work function metal layer 180 may be formed to have a thickness ranging from about 2 nm to about 3.5 nm.

Figures 29A, 29B, 29C:
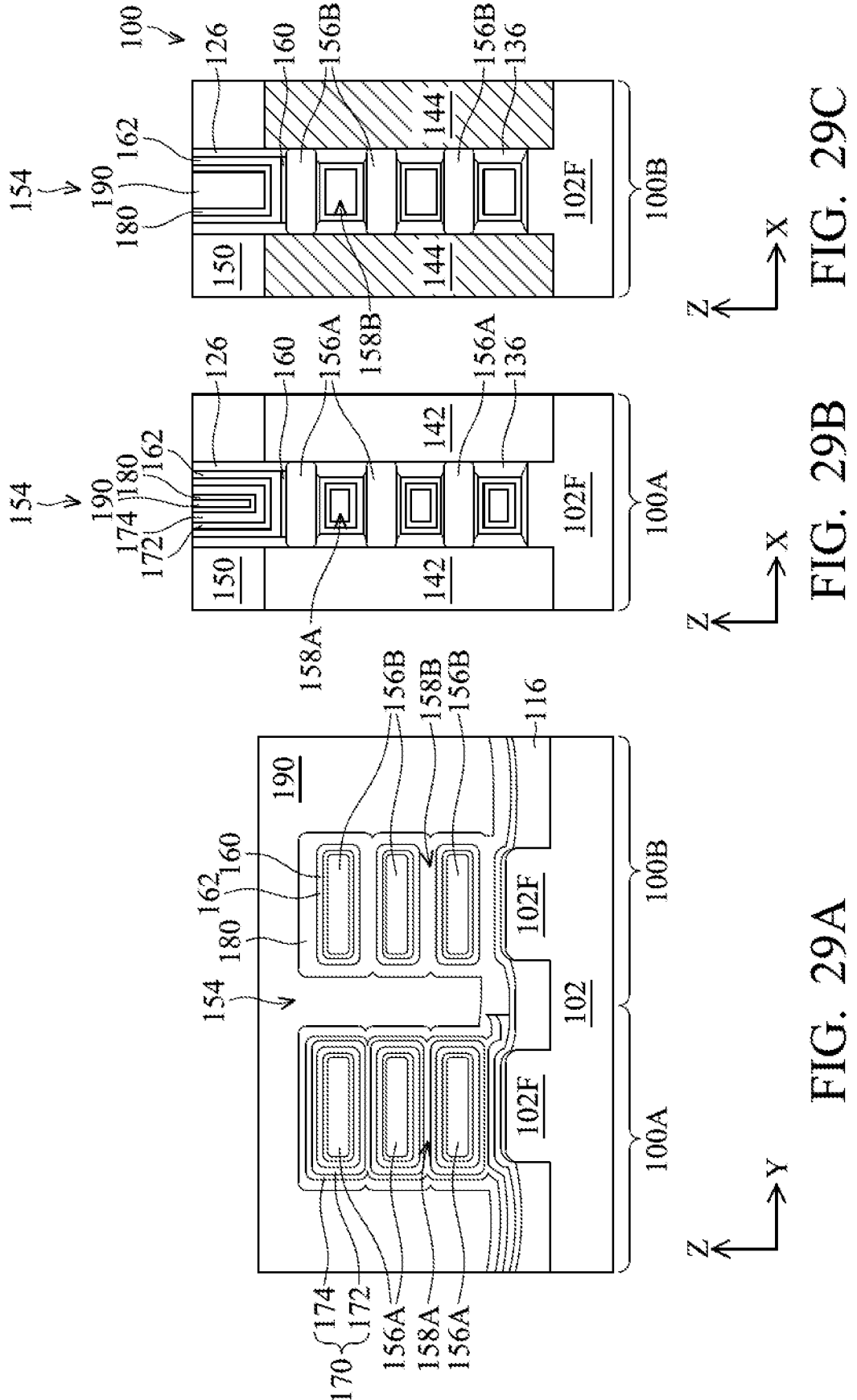

Turning to FIGS. 29A-29C, a metal gate fill material layer 190 is deposited to fill the gate trench 154. In some embodiments, the metal gate fill material layer 190 may include tungsten (W) or cobalt (Co) and may be deposited by CVD, PVD or ALD. Subsequently, excess portions of the metal gate fill material layer 190, the p-type work function metal layer 180, the cap layer 174, the n-type work function metal layer 172, and the gate dielectric layer 162 on a top surface of the ILD layer 150 are removed by a planarization process such as a CMP process, in accordance with some embodiments. The top surfaces of the ILD layer 150, the gate dielectric layer 162, the n-type work function metal layer 172, the cap layer 174, the p-type work function metal layer 180, and the metal gate fill material layer 190 are thus coplanar with each other in the gate trench 154.

One aspect of this description relates to a method for forming a semiconductor device. The method includes forming a plurality of first channel nanostructures in an n-type device region of a substrate and a plurality of second channel nanostructures in a p-type device region of the substrate. The method further includes depositing a gate dielectric layer to surround each of the first channel nanostructures and each of the second channel nanostructures. The method further includes depositing an n-type work function metal layer over the gate dielectric layer. The method further includes depositing a cap layer over the n-type work function metal layer, wherein the cap layer merges in first spaces between adjacent first channel nanostructures and merges in second spaces between adjacent second channel nanostructures. The method further includes selectively removing the cap layer and the n-type work function metal layer in the p-type device region. The method further includes depositing a p-type work function metal layer over the cap layer in the n-type device region and the gate dielectric layer in the p-type device region, wherein the p-type work function metal layer merges in the second spaces between the adjacent second channel nanostructures.

Another aspect of this description relates to relates to a method for forming a semiconductor device. The method includes forming first channel nanostructures in an n-type device region and second channel nanostructures in a p-type device region. The method further includes forming an interfacial layer to surround each of the first channel nanostructures and each of the second channel nanostructures, wherein the interfacial layer has a thickness ranging from about 1.25 nm to about 1.5 nm. The method further includes depositing a gate dielectric layer on the interfacial layer to surround each of the first channel nanostructures and each of the second channel nanostructures. The method further includes depositing a sacrificial layer on the gate dielectric layer to surround each of the first channel nanostructures and each of the second channel nanostructures, wherein the sacrificial layer merges in first spaces between the first channel nanostructures and merges in second spaces between the second channel nanostructures. The method further includes etching the sacrificial layer such that only portions of the sacrificial layer disposed in the first spaces between the first channel nanostructures and disposed in the second spaces between the second channel nanostructures remain. The method further includes removing the sacrificial layer from the n-type device region. The method further includes depositing an n-type work function metal layer on the gate dielectric layer to surround each of the first channel nanostructures in the n-type device region and on the gate dielectric layer and the sacrificial layer in the p-type device region. The method further includes depositing a cap layer on the n-type work function metal layer in both the n-type device region and the p-type device region, wherein the cap layer surrounds each of the first channel nanostructures and merges in the first spaces between the first channel nanostructures. The method further includes removing the n-type work function metal layer and the cap layer from the p-type device region. The method further includes depositing a p-type work function metal layer to surround each of the second channel nanostructures in the p-type device region and to cover the cap layer in the n-type device region, wherein the p-type work function metal layer merges in the second spaces between the second channel nanostructures.

Still another aspect of this description relates to a semiconductor device. The device includes a substrate; a plurality of first channel nanostructures spaced apart from each other and in an n-type device region of the substrate; a plurality of second channel nanostructures spaced apart from each other and in a p-type device region of the substrate; a gate dielectric layer surrounding each of the first channel nanostructures and each of the second channel nanostructures; an n-type work function metal layer on the gate dielectric layer and surrounding each of the first channel nanostructures; a cap layer on the n-type work function metal layer and surrounding each of the first channel nanostructures, the cap layer filling spaces between adjacent first channel nanostructures and comprising TiN, TiSiN or a combination thereof; a p-type work function metal layer on the gate dielectric layer and the cap layer and surrounding each of second channel nanostructures, the p-type work function metal layer filling spaces between adjacent second channel nanostructures; and a metal gate fill material layer over the p-type work function metal layer in the p-type and n-type device regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a plurality of first channel nanostructures in an n-type device region of a substrate and a plurality of second channel nanostructures in a p-type device region of the substrate;

depositing a gate dielectric layer to surround each of the first channel nanostructures and each of the second channel nanostructures;

depositing an n-type work function metal layer over the gate dielectric layer;

depositing a cap layer over the n-type work function metal layer, wherein the cap layer fills remaining volumes of first spaces between adjacent first channel nanostructures and remaining volumes of second spaces between adjacent second channel nanostructures;

selectively removing the cap layer and the n-type work function metal layer from the second channel nanostructures in the p-type device region to re-expose the second spaces; and depositing a p-type work function metal layer over the cap layer in the n-type device region and the gate dielectric layer in the p-type device region, wherein the p-type work function metal layer fills the remaining volumes of the second spaces between the adjacent second channel nanostructures.

2. The method of claim 1, wherein selectively removing the cap layer and the n-type work function metal layer in the p-type device region comprises:

forming a patterned mask layer covering the n-type device region while exposing the p-type device region;

performing a first etching process to etch an uncovered portion of the cap layer in the p-type device region;

performing a second etching process to etch an uncovered portion of the n-type work function metal layer in the p-type device region; and removing the patterned mask layer.

3. The method of claim 1, further comprising forming an interfacial layer wrapping around each of the first channel nanostructures and each of the second channel nanostructures prior to depositing the gate dielectric layer.

4. The method of claim 1, further comprising depositing a metal gate fill material layer over the p-type work function metal layer.

5. The method of claim 1, wherein the cap layer comprises TiN, TiSiN or a combination thereof.

6. The method of claim 1, wherein the n-type work function metal layer comprises Al, TiAl, TiAlC, TaAlC, TaSiAl, TaSiC, TaSi or HfC.

7. The method of claim 1, wherein the p-type work function metal layer comprises W, Mo, WN, WCN, TaSiN or TaN.

8. The method of claim 1, wherein the n-type work function metal layer has a thickness about 0.5 nm to about 1 nm thinner than a thickness of the p-type work function metal layer.

9. The method of claim 8, wherein the thickness of the n-type work function metal layer ranges from about 1.5 nm to about 2.5 nm.

10. The method of claim 1, further comprising forming first source/drain regions on opposite sides of the first channel nanostructures and forming second source/drain regions on opposite sides of the second channel nanostructures.

11. A method for forming a semiconductor device, comprising:

forming first channel nanostructures in an n-type device region and second channel nanostructures in a p-type device region;

forming an interfacial layer to surround each of the first channel nanostructures and each of the second channel nanostructures, wherein the interfacial layer has a thickness ranging from about 1.25 nm to about 1.5 nm;

depositing a gate dielectric layer on the interfacial layer to surround each of the first channel nanostructures and each of the second channel nanostructures;

depositing a sacrificial layer on the gate dielectric layer to surround each of the first channel nanostructures and each of the second channel nanostructures, wherein the sacrificial layer merges in first spaces between the first channel nanostructures and merges in second spaces between the second channel nanostructures, wherein the sacrificial layer comprises a dielectric material;

etching the sacrificial layer such that only portions of the sacrificial layer disposed in the first spaces between the first channel nanostructures and disposed in the second spaces between the second channel nanostructures remain;

removing the sacrificial layer from the n-type device region;

depositing an n-type work function metal layer on the gate dielectric layer to surround each of the first channel nanostructures in the n-type device region and on the gate dielectric layer and the sacrificial layer in the p-type device region;

depositing a cap layer on the n-type work function metal layer in both the n-type device region and the p-type device region, wherein the cap layer surrounds each of the first channel nanostructures and merges in the first spaces between the first channel nanostructures;

removing the n-type work function metal layer and the cap layer from the p-type device region; and depositing a p-type work function metal layer to surround each of the second channel nanostructures in the p-type device region and to cover the cap layer in the n-type device region, wherein the p-type work function metal layer merges in the second spaces between the second channel nanostructures.

12. The method of claim 11, further comprising forming a first patterned mask layer covering the p-type device region while exposing the n-type device region prior to removing the sacrificial layer from the n-type device region, wherein the sacrificial layer is removed using the first patterned mask layer as an etch mask.

13. The method of claim 11, further comprising forming a second patterned mask layer covering the n-type device region and exposing the p-type device region, wherein the n-type work function metal layer and the cap layer are removed from the p-type device region using the second patterned mask layer as an etch mask.

14. The method of claim 11, wherein the sacrificial layer comprises silicon oxide, aluminum oxide, zirconium oxide or silicon nitride.

15. The method of claim 11, further comprising depositing a metal gate fill material layer over the p-type work function metal layer.

16. A method for forming a semiconductor device, comprising:

providing, for an n-type transistor, vertically stacked first channel nanostructures spaced apart by first spaces, and, for a p-type transistor, vertically stacked second channel nanostructures spaced apart by second spaces;

depositing a gate dielectric layer around the first and second channel nanostructures;

forming an n-type metal gate layer on the gate dielectric layer and around the first and second channel nanostructures, the n-type metal gate layer filling the first spaces and the second spaces;

forming a patterned mask layer to cover a portion of the n-type metal gate layer over the first channel nanostructures, while exposing a portion of the n-type metal gate layer over the second channel nanostructures;

removing the exposed portion of the n-type metal gate layer from the second channel nanostructure to re-expose the second spaces;

removing the patterned mask layer; and depositing a p-type work function metal layer on a portion of the gate dielectric layer around the second channel nanostructures and on a remaining portion of the n-type metal gate layer around the first channel nanostructures, the p-type work function metal layer filling the second spaces.

17. The method of claim 16, further comprising depositing a metal gate fill material layer over the p-type work function metal layer.

18. The method of claim 16, further comprising forming first source/drain regions on opposite sides of the first channel nanostructures and forming second source/drain regions on opposite sides of the second channel nanostructures.

19. The method of claim 16, further comprising forming an interfacial layer around the first and second channel nanostructures prior to forming the gate dielectric layer.

20. The method of claim 16, wherein the n-type metal gate layer comprises an n-type work function metal layer and a cap layer over the n-type work function layer, wherein forming the n-type metal gate layer comprises:

depositing the n-type work function layer over the gate dielectric layer and around the first and second channel nanostructures, the n-type work function metal layer partially fills the first spaces and the second spaces; and depositing the cap layer over the n-type work function layer to fill remaining volumes of the first and second spaces, and wherein removing the exposed portion of the n-type metal gate layer comprises removing portions of the cap layer and the n-type work function layer not covered by the patterned mask layer.

* * * * *